United States Patent [19]

Miyawaki et al.

[11] Patent Number: 5,477,490

[45] Date of Patent: Dec. 19, 1995

[54] MEMORY CONTROL DEVICE

[75] Inventors: Hirotomo Miyawaki; Noriyuki Suzuki; Shigeatsu Samukawa; Masahiro Shirai, all of Kawasaki; Naomi Ikeda, Fukuoka, all of Japan

[73] Assignee: Fujitsu Limited, Kawasaki, Japan

[21] Appl. No.: 289,259

[22] Filed: Aug. 11, 1994

[30] Foreign Application Priority Data

Sep. 20, 1993 [JP] Japan .................................. 5-257583
Jun. 17, 1994 [JP] Japan .................................. 6-136094

[51] Int. Cl.⁶ .............................. G11C 7/00; G11C 8/00
[52] U.S. Cl. .................... 365/194; 365/189.12; 365/219; 365/239; 365/240
[58] Field of Search ........................... 365/194, 189.12, 365/219, 239, 240

[56] References Cited

U.S. PATENT DOCUMENTS

| | | | |
|---|---|---|---|
| 4,435,792 | 3/1984 | Bechtolsheim | 365/189.02 X |
| 4,506,348 | 3/1985 | Miller et al. | 365/194 |
| 4,866,675 | 9/1989 | Kawashima | 365/194 |
| 4,876,670 | 10/1989 | Nakabayashi et al. | 365/194 |
| 4,905,192 | 2/1990 | Nogami et al. | 365/194 X |
| 5,084,839 | 1/1992 | Young | 365/189.12 X |

*Primary Examiner*—David C. Nelms
*Assistant Examiner*—Son Dinh
*Attorney, Agent, or Firm*—Greer, Burns & Crain, Ltd.

[57] ABSTRACT

An elastic memory determines an amount of delay of input data relative to other input data according to a phase difference between synchronous pulses each indicating a header of a frame of the associated input data. The elastic memory thus synchronizes both input data in the channel level. Both input data are time-division multiplied by a first multiplier. On the other hand, each counter receives synchronous pulses and thereby counting up to make a ROM produce address value of which order is determined previously according to the counted value. These address values are multiplied by a second multiplier. A decoder controls a RAM, a high-impedance control unit and a flip-flop to write in and read out of the RAM the input data. The read data are divided by a signal restoring device.

14 Claims, 10 Drawing Sheets

5,477,490

MEMORY CONTROL DEVICE

BACKGROUND OF THE INVENTION

1. Field of the Invention

This invention relates to a memory control device. More particularly, this invention relates to a control device used between two systems that each is based on different data format from the other's for converting a format of an input data into any adequate format to produce an output data having the converted format.

2. Description of the Invention

Conventionally, synchronous digital terminal equipment has been used as a hardware in a communication network. The term "synchronous digital terminal lequipment" used herein is a general term indicating a set of devices each of which is capable of receiving a digital signal supplied from a time division switch or other data signal lines and transmitting the received digital signal to a transmission path or vise versa. The synchronous digital terminal equipment comprises a time slot interchanger (TSI) unit performing a communication line establishing function. This TSI unit interchanges time slots on a digital multiple signal supplied from the communication path or a signal source without decomposing it physically into individual channels, whereby converting the data format of the input signal into that suitable for an output signal.

An example of this format conversion is described in conjunction with FIG. 9. In FIG. 9, an input data (DATA IN) is transmitted as a sequence of frames (fixed length data). Each frame is assumed to consist of sixteen channels (unit data) transmitted from two or more transmitting terminals. Each channel corresponds to one time slot. The channels transmitted from the identical transmitting terminal are identified by the same alphabet. In addition, the channels identified by the same alphabets are also identified by numerals with time. For example, "A1" indicates that the channel identified by it is the channel transmitted first from a transmitting terminal A. The frame of the input data (DATA IN) has a format consisting of the channels in which those identified by the same alphabet are collected together. More specifically, the channels identified by the same alphabet are sequenced in the numerical order. This sequence of channels is followed by another sequence of channels identified by the same alphabet. In this way, the sequence of channels follows in the alphabetical order. The TSI unit converts the format of the input data depending on a format suitable for the receiving system. More specifically, the TSI unit converts the format of the input data (DATA IN) into a format, as shown in an output data (DATA OUT) in this figure, where the channels bearing the same numeral are collected together and sequences of the channels bearing the same numeral are aligned in the alphabetical order. The above mentioned conversion is referred to as a format conversion or an interchange of channel orders. In FIG. 9, FP represents synchronous pulses indicating the start of each frame of the input data (DATA IN).

A conventional memory control device applicable to the above mentioned format conversion is described in conjunction with a block diagram shown in FIG. 10. First, connection of the individual blocks in FIG. 10 is described. An input data (DATA1IN) is supplied to this memory control device through an input line φ1 and is supplied in turn to a data input and output terminal of a random access memory (RAM) 501 through a high-impedance control unit 504. A synchronous pulse (FP1) corresponding to this input data (DATA1IN) is supplied to this memory control device through a signal line φ2 and is supplied in turn to an address generating unit 502 as well as a RAM control pulse generating unit 503. The address generating device 502 is connected to an address input terminal of the RAM 501. The RAM control pulse generating unit 503 is connected to each of control pulse input terminals of the RAM 501, a control terminal of the high-impedance control 504 and a clock pulse (CK) input terminal of a flip-flop 505. D input terminal of the flip-flop 505 is connected to an input and output terminal of the RAM 504.

Next, function of each block in FIG. 10 is described.

The high-impedance control unit 504 varies impedance conditions on the input data (DATA1IN) in response to control pulses supplied from the RAM control pulse generating unit 503. The high-impedance control unit 504 whereby controls supply of the input data (DATA1IN) to the RAM 501. More specifically, the impedance is decreased to allow passage of the input data (DATA1IN) during writing of the input data (DATA1IN) into the RAM 501. On the other hand, the impedance is increased to impede pass of the input data (DATA1IN) during reading the data stored in the RAM 501.

The RAM 501 stores the input data (DATA1IN) received through the input and output terminal according to a writing address. The writing address is an address designated by the address generating unit 502, indicating where the data should be written in the RAM. In addition, the RAM 501 supplies the stored data to the input and output terminal according to a reading address. The reading address is an address designated by the address generating unit 502, indicating a read position in the RAM. The RAM 501 performs writing operation in synchronism the control pulses supplied from the RAM control pulse generating unit 503. The address generating unit 502 designates addresses. The address generating unit 502 changes a value of the address to be designated according to a given order at every time when it receives the synchronous pulse (FP1).

The flip-flop 505 receives the read data from the RAM 501 through its D input terminal. The flip-flop 505 receives the control signal supplied from the RAM control pulse generating unit 503 through the CP input terminal. An output data (DATA1OUT) is supplied from the output terminal of the flip-flop 505. The flip-flop 505 thus serves as a D flip-flop.

The RAM control pulse generating unit 503 generates control pulses for the RAM 501, the high-impedance control unit 504 and the flip-flop 505 at a predetermined timing at every time in response to the synchronous pulse (FP1).

Next, operation of the conventional memory control device so constructed is described.

First, in writing the input data (DATA1IN) into the RAM 501, the RAM control pulse generating unit 503 supplies, in response to the synchronous pulse (FP1), the writing pulse to the RAM 501 and renders the high-impedance control unit 504 low in impedance. This allows writing of the input data (DATA1IN) into the RAM 501. In addition, the RAM control pulse generating unit 503 stops clock pulse input to the flip-flop 505. This prevents the input data (DATA1IN) from being produced outside the device as it is. At the same time, the address generating unit 502 designates the writing address while varing the value of the address according to a predetermined order in response to input of the synchronous pulses (FP1). As a result, the input data (DATA1IN) is written into the RAM 501 in the order as shown in, for example, DATA IN in FIG. 10.

Next, in reading the data stored in the RAM 501, the RAM control pulse generating unit 503 stops the writing pulses to the RAM 501 and renders the high-impedance control unit 504 high in impedance. This hinders passage of the input data (DATA1IN) in the high-impedance control unit 504. In addition, the RAM control pulse generating unit 503 supplies clock pulses to the flip-flop at a predetermined fixed cycle. This allows output of the read data. At the same time, the address generating unit 502 designates the reading address while varing the value of the address according to the order different from the order of writing. As a result, the data written in the RAM is supplied as the output data (DATA1OUT) to the outside the device through the flip-flop 505 in the order shown in, for example, DATA OUT in FIG. 9. Switching of writing and reading may be made in various ways, of which description is omitted herein.

Typically, two or more sequences of data should be processed simultaneously in the TSI unit. The term "two or more sequences of data" used herein means a plurality of data supplied separately from the parallel input lines $\phi 1$. However, in the above mentioned conventional memory control device, only one sequence of data is allowed to be supplied and processed for a single device. Accordingly, a plurality of data control devices having the identical structure should be provided as shown in FIG. 10 for processing a plural sequences of data. In such a case, plurality of circuits such as the RAMs and RAM control pulse generating units should be provided, which enlarges the dimension and scale of the hardware that can only be achieved at an extremely high cost.

SUMMARY OF THE INVENTION

The present invention is directed to provide a memory control device that is capable of processing two or more sequences of data simultaneously in the single device and that contributes to reduce the number of the circuits as well as the scale of the hardware.

A memory control device according to this invention is a memory control device that receives a fixed length data consisting of a plurality of continuous unit data to store them in a storing device and that reads the unit data out of the storing device in a predetermined order to produce the fixed length data, wherein the device comprises a delaying device for delaying one sequence of fixed length data relative to other sequence of fixed length data in such a manner that a header timing of each unit data forming the one sequence of the fixed length data coincides with a header timing of each unit data forming the other sequence of the fixed length data; a multiplying device for multiplying the sequences of the fixed length data that are synchronized with each other by the delaying device for each data unit; a storing device for storing the two or more sequences of fixed length data multiplied by the multiplying device with being associated with a predetermined writing address and for producing the fixed length data stored according to a predetermined reading address; a writing address designating device for designating the predetermined writing address while changing it according to a predetermined order; a reading address designating device for designating the predetermined reading address while changing it according to a given order; and a restoring device for restoring the multiplied fixed length data read out of the storing device to divide it into separate sequences of the fixed length data for production.

A memory control method according to the present invention for use in achieving the above mentioned object is characterized by receiving two or more sequences of input data each consisting of a fixed length data consisting of a plurality of continuous unit data; delaying one sequence of fixed length data relative to other sequence of fixed length data in such a manner that a header timing of each unit data forming the one sequence of the fixed length data coincides with a header timing of each unit data forming the other sequence of the fixed length data; multiplying the one sequence of the fixed length data with the other sequence of the fixed length data after delay; storing in a storing device the multiplied input data according to addresses continuously designated in a predetermined order; reading out of the storing device the data stored in the storing device according to addresses continuously designated in a predetermined order; and restoring the multiplied fixed length data read out of the storing device to divide it into separate sequences of the fixed length data for production.

BRIEF DESCRIPTION OF THE DRAWING

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

First Embodiment

Figure 1:
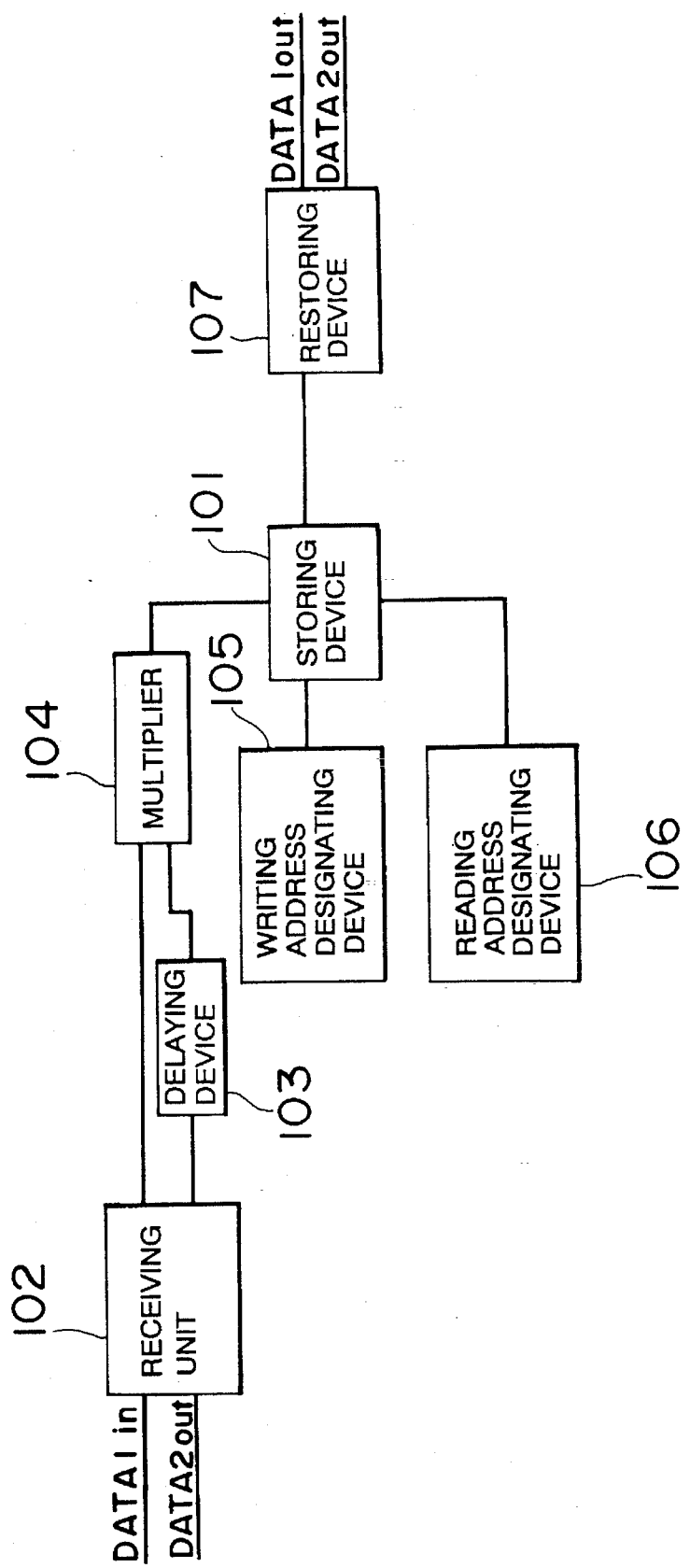
FIG. 1 is a block diagram showing a structure of a first embodiment of the present invention.

FIG. 1 shows a memory control device according to a first embodiment of the present invention.

This device is an embodiment where a head timing of unit data forming input data of one sequence is synchronized with a head timing of unit data forming input data of other sequence and where these input data are multiplied and written in a memory.

The memory control device is supplied with a plural sequences of input data, i.e., a first input data (DATA1IN) and a second input data (DATA2IN). The memory control device comprises a receiving unit 102 for receiving these input data first, a delaying device 103 connected to the receiving unit 102, a multiplier 104 connected to the receiving unit 102 and the delaying device 103, a storing device 101 connected to the multiplier 104, a writing address designating device 105 and a reading address designating device 106 each connected to the storing device 101, and a restoring unit 107 connected to the storing unit 101 for producing a first output data (DATA1OUT) corresponding to the first input data (DATA1IN) and a second output data (DATA2OUT) corresponding to the second input data (DATA2IN).

Each input data is a fixed length data consisting of a plurality of unit data. The fixed length data may be a frame or a packet. In addition, a data on a single channel may be dealt with a unit data. Data on two or more channels may be dealt with the unit data. A set of two or more unit data may be considered as being forming a data on a single channel.

The receiving unit 102 that serves as receiving means receives the plural sequences of the fixed length data. The "plural sequences" may be two or more sequences of data. A single sequence of data may be a data in which fixed length data are transmitted continuously or may be a data in which the fixed length data is transmitted solely. The receiving unit 102 is not required to provide a specific circuit or the like. This means that any one of the components that first receives the fixed length data generated outside the memory control device acts as the receiving unit 102. Of course, a specific receiving circuit may be provided separately.

The delaying device 103 that serves as delaying means delays one sequence of the fixed length data of the plural sequences of the data received by the receiving unit 102 relative to the other sequence of the fixed length data. As a result, a head timing of each unit data forming the one sequence of the fixed length data coincides with the head timing of each unit data forming the other sequence of the fixed length data. An amount of delay obtained in this delaying device 103 may be determined previously. Alternatively, the delaying device 103 may comprise a phase difference detector for detecting a phase difference between the fixed length data of the plural sequences and the amount of delay may be determined according to the phase difference detected by the phase detector. The phase detector may receive directly the plural sequences of the fixed length data to detect the phase difference therebetween. Alternatively, the phase detector may receive synchronous signals indicating headers of the fixed length data to detect the phase difference therebetween, thereby recognizing the phase difference of the fixed length data of the plural sequences.

The multiplier 104 that serves as multiplying means multiplies the plural sequences of the fixed length data synchronized for each unit data by the delaying device 103. The multiplying device 104 may be so constructed as to carry out time-division multiple on the fixed length data supplied.

The storing device 101 that serves as storing means stores the plural sequences of the fixed length data multiplied by the multiplier 104 associating them with a predetermined writing address. In addition, the storing device 101 reads the stored fixed length data to produce them according to a predetermined reading address. The storing device 101 may be a random access memory (RAM), an erasable programmable read-only memory (EPROM) or an electrically erasable programmable read-only memory (EEPROM).

The writing address designating unit 105 designating the writing address that is used for writing the data in the storing device 101 while varying the value of the address according to a predetermined order. In addition, the reading address designating unit 106 designates the reading address that is used for reading the data out of the storing device 101 while changing the value of the address according to a predetermined order. The order of reading of the unit data during reading may be different from or same as the order of wiring of the same unit data during wiring. With the different order, the format of the frame or the like can be converted. On the other hand, with the same order, the memory control device can be used as a first-in first-out (FIFO) memory. The writing and reading address designating devices 105 and 106 may be formed as the individual components or as an integral component.

In addition, these address designating devices 105 and 106 may be constructed so that they can designate the writing address on all the fixed length data of the plural sequences in synchronism with receiving of synchronous pulses which synchronize with a header of the fixed length data.

Similarly, the reading address designating device 106 may be so constructed that one reading address designating device 106 can designate the reading address on all the fixed length data of the plural sequences. In such a case, the output of the address designating device 105 or 106 is not required to be multiplied. On the other hand, the address designating device 105 and 106 are provided for each data of the plural sequences such that the memory control device comprises a plurality of address designating device 105 and 106. In such a case, the outputs of the plurality of address designating devices 105 and 106 may be time-division multiplied in the same order as performed by the multiplier 104. In addition, when a plurality of address designating devices 105 and 106 are provided, the output of the address designating device 105 or 106 corresponding to the data sequence delayed by the delaying device 103 may be delayed before being produced. Alternatively, the output timings of the address designating devices 105 and 106 may be shifted previously in synchronism with the amount of delay.

The storing device 101 may switch a writing status and a reading status for each unit data. Alternatively, the storing device 101 may switch the writing status and the reading status for each fixed length data. The address designating devices 105 and 106 may switch the writing address and reading address to be desinated according to these switching of the storing device.

A so-called single-buffer technique or a so-called double-buffer technique may be applied to the storing device 101. The address designating devices 105 and 106 may switch designated positions to designate the addresses.

In the memory control device so constructed according to the first embodiment, the receiving unit 102 receives a plural sequences of the fixed length data. In response to this, the delaying device 103 delays the data of one sequence of the plural sequences of the data relative to the data of the other sequence in accordance with the phase difference between the plural sequences of data, thereby synchronizing these data with each other. After synchronization, the multiplier 104 multiplies these plural sequences of data. The multiplied signals are written in the storing device 101 at an address position designated by the writing address designating device 105. Subsequently, the written data is read out of the storing device 101 according to the order designated by the reading address designating device 106. The restoring device 107 divides the read data into separate sequences of data.

In this way, the memory control device according to the present invention is capable of processing the plural sequences of data simultaneously in the single device. Accordingly, it becomes possible to reduce the number of the circuits such as the RAM as well as the scale of the device.

In addition, the delaying device 103 may be so constructed as to delay at a minimum amount required to coincide the unit data forming one sequence of data with the data forming the other sequence of data when the one sequence of data is delayed relative to the other. This makes it possible to process these data with the phases inherent to the individual fixed length data of the plural sequences being maintained to a certain degree.

Second Embodiment

Figure 2:
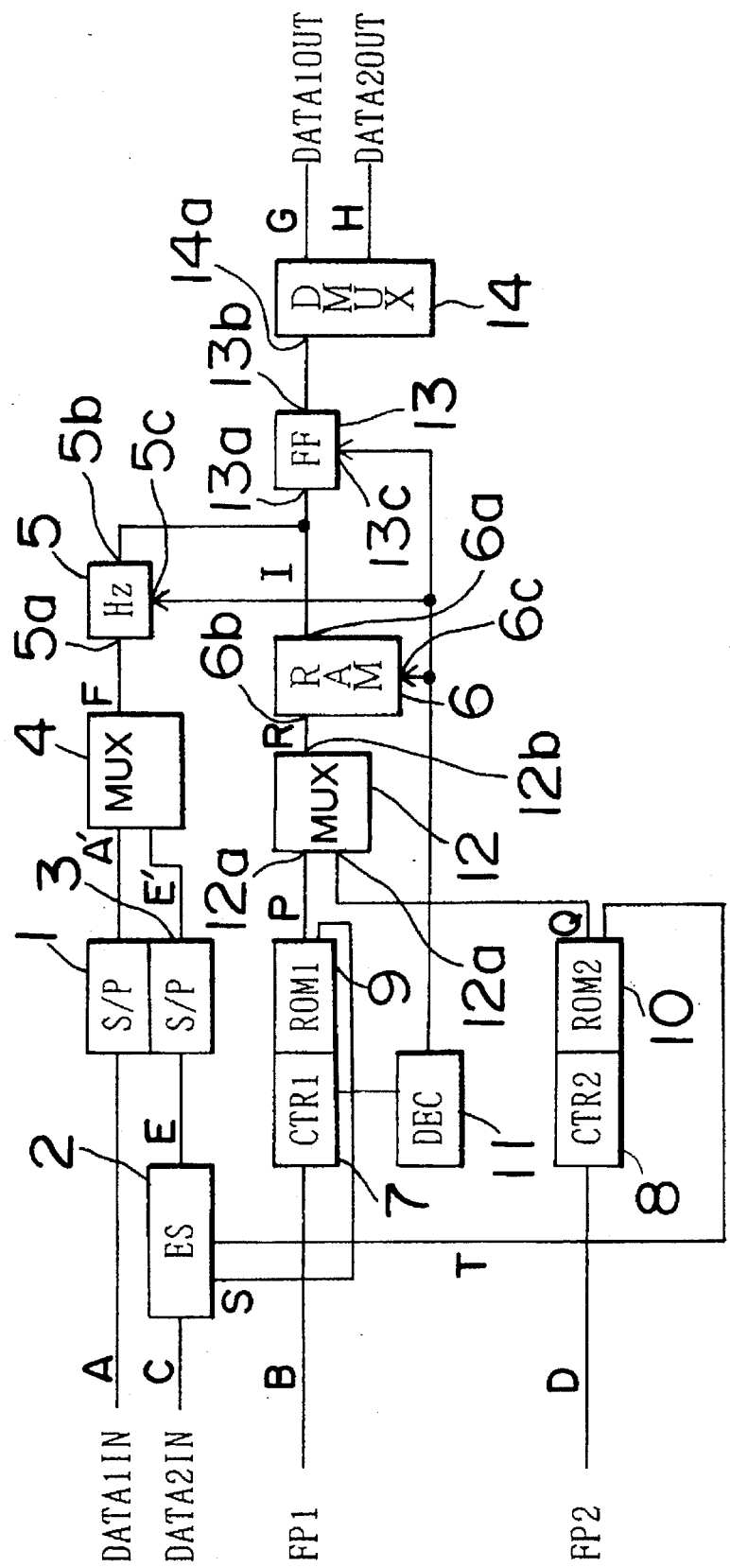
FIG. 2 is a block diagram showing a structure of a second embodiment of the present invention.

FIG. 2 is a block diagram showing a structure of a memory control device according to a second embodiment of the present invention.

For facilitate the understanding, the following is described provided that the data used in this embodiment have formats as shown in FIGS. 4A, 4C, 4E, 5A' and 5E'. More specifically, channels D0 through D5 each having an eight-bit length are aligned according to a predetermined order (D0, D3, D1, D4, D2, D5). These six channels together form one frame. Data in which such frames are transmitted continuously is the input data (DATA1IN, DATA2IN) used herein. A second input data (DATA2IN) C has an advanced phase difference of two channels (2×8=16 bits) plus three bits (nineteen bits in total) relative to a first input data (DATA1IN) A.

First, connection of the individual blocks in the memory control circuit according to the second embodiment is described in conjunction with FIG. 2.

The first input data (DATA1IN) A is supplied directly to a first serial/parallel converter 1 as a serial and parallel conversion means. On the other hand, the second input data (DATA2IN) C is supplied to a second serial/parallel converter 3 as a serial and parallel conversion means through an elastic memory 2 as a delaying means. These first and second serial/parallel converters 1 and 3 are connected to a first multiplier 4 as a multiplier means. The first multiplier 4 is connected in turn to a data input terminal 5a of a high-impedance control unit 5. An output terminal 5b of the high-impedance control unit 5 is connected to a data input and output terminal 6a of a random access memory (RAM) 6 as a memory means.

On the other hand, first synchronous pulses (FP1) B synchronizing with headers of the individual frames of the first input data (DATA1IN) A are supplied to the elastic memory 2 and a first counter 7. Likewise, second synchronous pulses (FP2) D synchronizing with the headers of the individual frames of the second input data (DATA2IN) C are supplied to the elastic memory 2 and a second counter 8.

The first counter 7 is connected to a first ROM 9 as a writing and reading adress designating means and a decoder 11. The second counter 8 is connected to a second ROM 10 as a writing and reading adress designating means. The first and the second ROMs 9 and 10 are connected to input terminals 12a of a second multiplier 12 as a multiplier means and an elastic memory 2. An output terminal 12b of the second multiplier 12 is connected to an address input terminal 6b of the RAM 6.

The decoder 11 is connected to a control pulse input terminal 6c of the RAM 6, a control terminal 5c of the high-impedance control unit 5 and a CK input terminal 13c of a flip-flop 13. D input terminal 13a of the flip-flop 13 is connected to the data input and output terminal 6a of the RAM 6. An output terminal 13b of the flip-flop 13 is connected to an input terminal 14a of a signal restoring device 14 as a restoring means.

Figure 4:
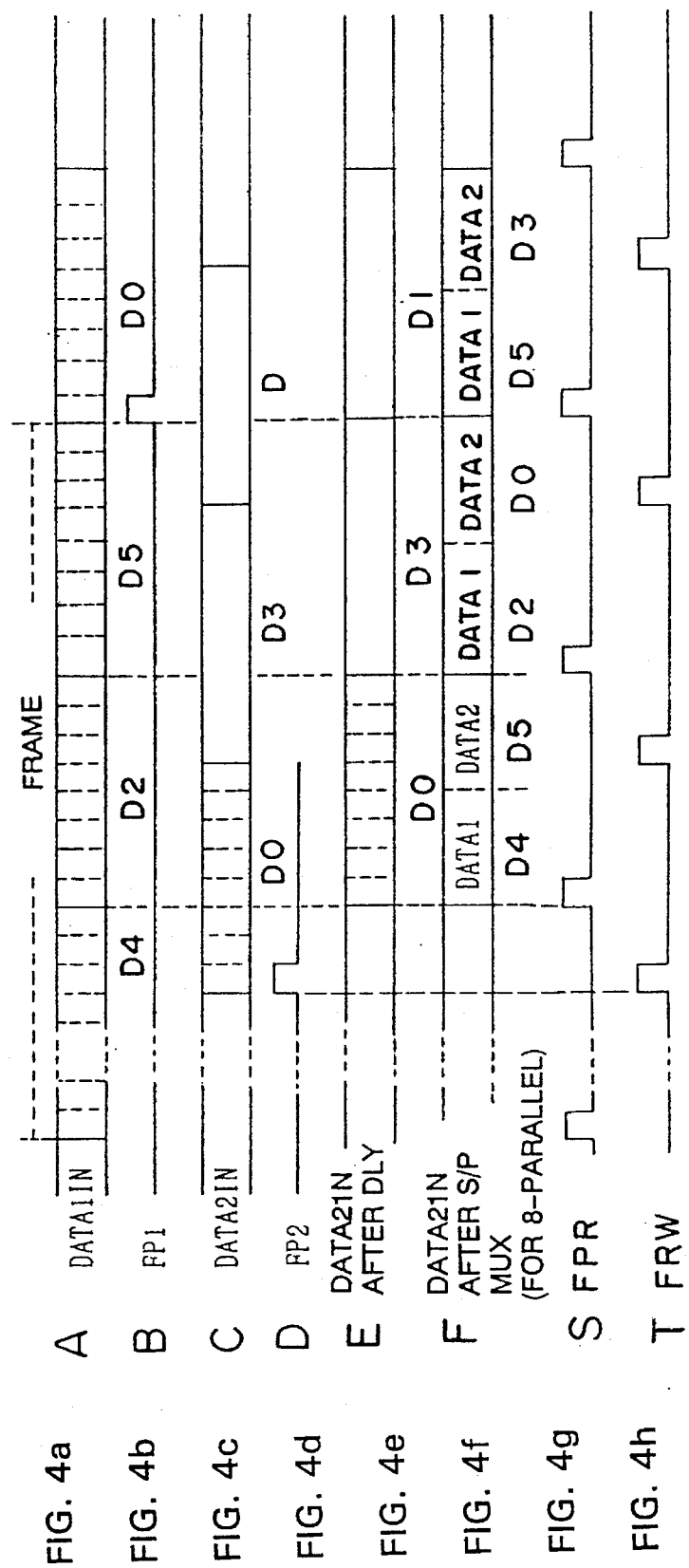
FIGS. 4a–4h are timing charts indicating input signals in FIG. 2.
Figure 5:
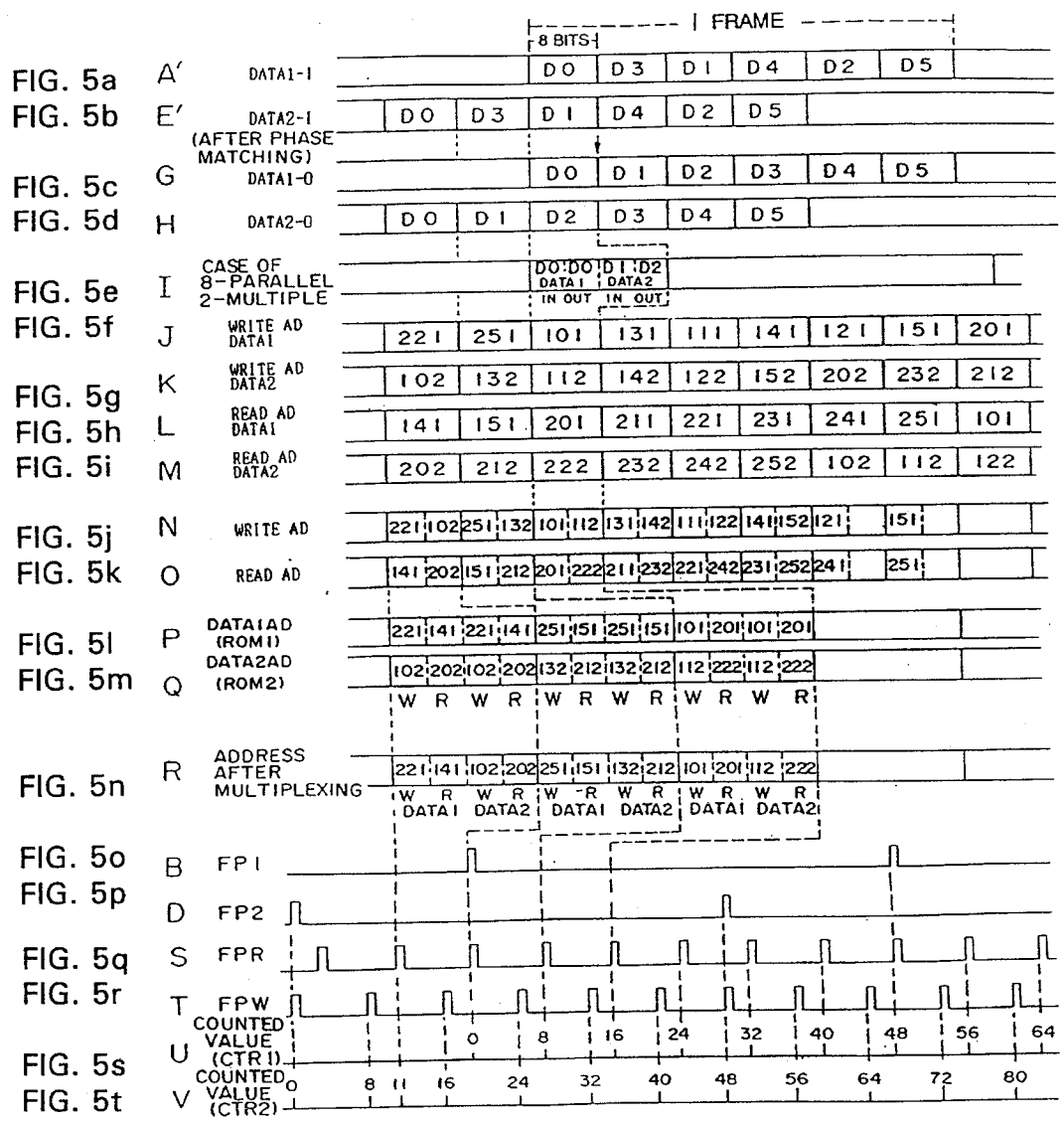
FIGS. 5a–5t are timing charts indicating signals in the individual components in FIG. 2.

Next, functions of the individual blocks in FIG. 2 are described in conjunction with timing charts shown in FIGS. 4 and 5.

The elastic memory 2 receives the reading pulses (FPR) S outputted from the first ROM 9 and the writing pulses (FPW) T outputted from the second ROM 9. In response to these pulses, the elastic memory 2 detects a phase difference between the first input data (DATA1IN) A and the second input data (DATA2IN) C. The elastic memory 2 delays the second input data (DATA2IN) C by an amount corresponding to the detected phase difference (E). The elastic memory 2 thus has a function of synchronizing the input data (DATA1IN, DATA2IN) A and E with each other.

In this event, the phase difference to be detected is described. As mentioned above, the input data (DATA1IN, DATA2IN) A and C used herein are shifted from each other by nineteen bits. The elastic memory 2 is not designed to detect this difference as it is for synchronization based on the frames. More specifically, the elastic memory 2 detects b given by the following equations:

$$(8 \times \Delta + \beta[\textit{total difference amount}]) - (8 \times \alpha) = \beta,$$

where $\alpha$: $0, 1, 2, \ldots, 0 \leq < 8$. The elastic memory 2 performs synchronization based on channels according to the given difference amount. In the above embodiments the total difference amount is equal in number to nineteen and $\beta$ is equal in number to three. Accordingly, to delay the second input data (DATA2IN) C by three bits permits complete synchronization of a header of the channel (e.g., D0) of the delayed second input data (DATA2IN) E with the header of the channel (e.g., D2) of the first input data (DATA1IN) A while the headers of the frames are not always synchronized with each other.

Therefore, the pulses (FPR, FRW) S and T are supplied to the elastic memory 2. The reading pulse (FPR) S is produced in the first counter 7 and the first ROM 9 on the basis of the first synchronous pulse (FPI) B. The reading pulse (FPR) S is outputted every 8 bits after the point of the input of the first synchronic pulse (FP1) B. Accordingly, the reading pulse (FPR) S indicates the head of each channel which composes the first input data (DATA1IN) A. Similarly, the writing pulse (FPW) T is produced in the second counter 8 and the second ROM 10 on the basis of the second synchronic pulse (FP2) D. The writing pulse (FPW) T is outputted every 8 bits after the timing of the input of the second synchronic pulse (FP2) D. Accordingly, the writing pulse (FPW) T indicates the head of each channel which composes the second input data (DATA2IN) C. The elastic memory 2, as a kind of FIFO (first-in first-out) memory, stores the data in synchronizing with the timing of the input of the writing pulse (FPR) S, and outputs the data in synchronizing with the timing of the input of the reading pulse (FPW) T. Thus the memory control device synchronizes the first input data (DATA1IN) A and the second input data (DATA2IN) A, E at the channel revel with the second input data (DATA2IN) delayed.

As a result, it becomes possible to process the input data (DATA1IN, DATA2IN) A and E by using common clock and pulse timing.

Turning back to FIG. 2, the first serial/parallel converter 1 has a function of converting a signal format of each channel of the first input data (DATA1IN) A. More specifically, the first serial/parallel converter 1 converts a signal format formed as a serial signal of eight bits into an eight-bit parallel signal A' on eight parallel signal lines. Each channel of the parallel signal after conversion has an eight-bit length at the time when it is produced from the first serial/parallel converter 1. To convert the eight-bit serial signal into the parallel signal can be made only after the first serial/parallel converter 1 takes all eight-bit signals. Accordingly, a time lag equivalent to eight bits (which means the same time interval of eight bits in the input data A; same as below) is caused between before and after the conversion. Because of this, F in FIG. 4 is delayed by eight bits from A in the same figure. A timing chart on the converted input data (DATA1IN) is shown in A' in FIG. 5. The second serial/ parallel converter 3 has the same function as the first serial/parallel converter 1. A timing chart of the converted input data (DATA2IN) is shown in E' in FIG. 5.

The first multiplier 4 receives the first input data (DATA1IN) A' and the second input data (DATA2IN) E', both in the parallel format, to perform the time-division multiplying operation on these data to produce them with a four-bit length. Accordingly, the signal length of each channel at that time is the four-bit length. A multiplied output signal is shown in F in FIG. 4.

The high-impedance control unit 5 changes the impedance to the input data F in response to the control pulses supplied from the decoder 11, with which the high-impedance control unit 5 controls passage of the input data. More specifically, in writing the input data F into the RAM 6, the high-impedance control unit 5 lowers its impedance to allow writing of the input data F into the RAM 6. On the other hand, in reading the input data F out of the RAM 6, the high-impedance control unit 5 increases its impedance to hinder passage of the input data F. Accordingly, in reading the data stored in the RAM 6, this prevents the input data F and the data read out of the RAM 6 (hereinafter, referred to as a "read data") from being incorporated with each other at an section between the RAM 6 and the flip-flop 13. In other words, the second embodiment switches the writing status and reading status of the RAM 6 by two-bit length for each, and data for one channel is written or read at every switching of the status. Accordingly, the high-impedance control unit 5 switches by two-bit length the high and low impedance status (see I in FIG. 5).

Figure 3:
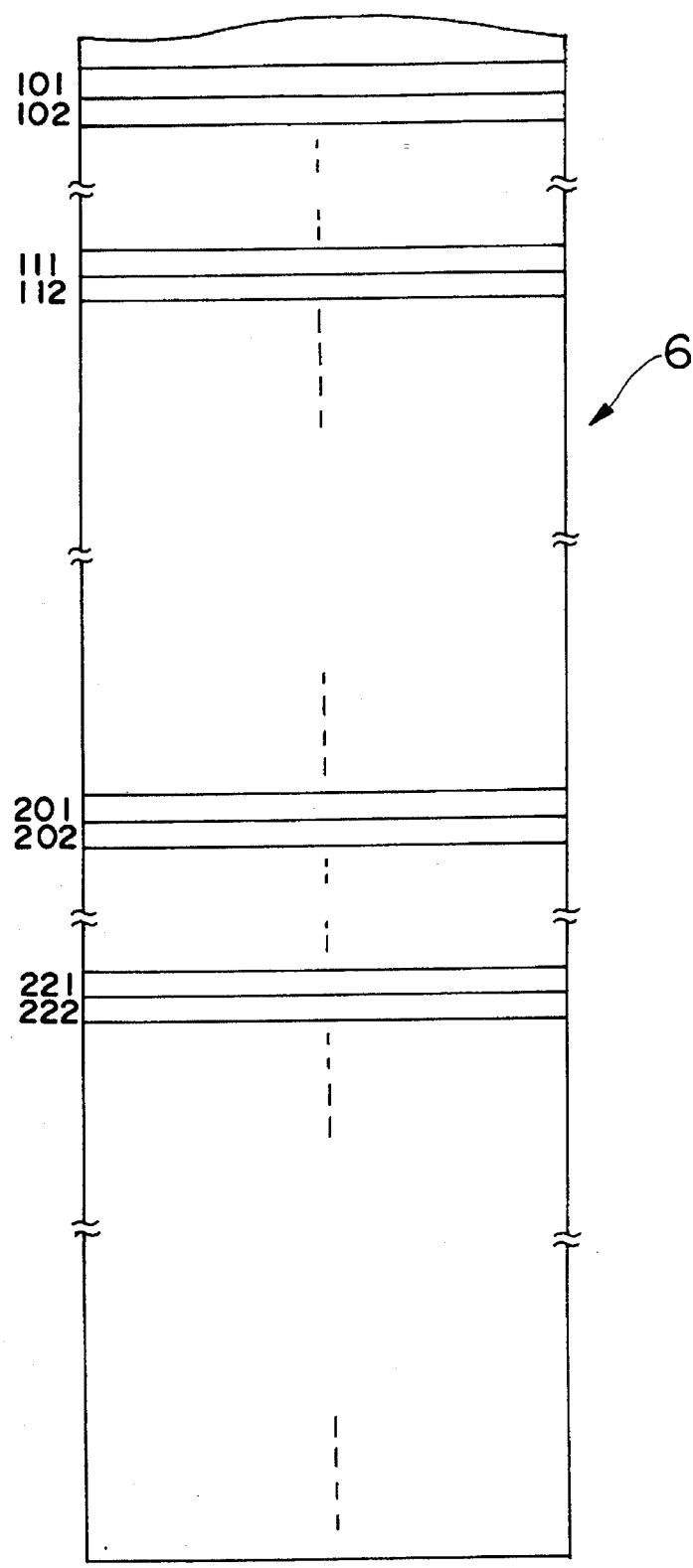
FIG. 3 is an address map in a random access memory in FIG. 2.

The RAM 6 stores the input data F(I) received through its data input and output terminal 6a according to the writing address. The writing address is an address transmitted from the second multiplier 12, indicating writing position in the RAM 6. The RAM 6 supplies the stored data to the data input and output terminal 6a according to the reading address. The reading address is an address transmitted from the second multiplier 12, indicating a reading position in the RAM 6. An address map of the RAM 6 is shown in FIG. 3. The RAM 6 performs the writing operation in synchronism with the control pulses supplied from the decoder 11. In this embodiment, as mentioned above, the writing and reading status are switched by every two-bit length. Accordingly, the signal status on the signal line between the RAM 6 and the flip-flop 13 is switched alternatively between the input signal (IN) and the output signal (OUT) as shown in I in FIG. 5.

At every time when receiving a first synchronous pulse (FP1) B twice, the first counter 7 clears a counted value and starts counting up from "0" at a one-bit length cycle and transmits the counted value to the ROM 9 (See U in FIG. 5).

The first ROM 9 stores various address values. The address values are associated with the counted value received from the counter 7 so as to match one address values to two counted value. That is, they are associated so that the address value will be changed once at every time when the counted value to be supplied is counted up twice.

The first ROM 9 thus changes the address values to be produced according to a given order in response to counting up of the counted value supplied. More specifically, the address values are changed at the two-bit length cycle according to the order shown in P in FIG. 5. Also, the first ROM 9 produces the reading pulse (FPR) S and inputs it to the elastic memory 2, at every time the counted value is a multiple of 8, to say, at the eight-bit length cycle.

Similarly, at every time when receiving a second synchronous pulse (FP2) D twice, the second counter 8 clears a counted value and starts counting up from "0" at a one-bit length cycle and transmits the counted value to the second ROM 10 (See V in FIG. 5).

The second ROM 10 stores various address values. The address values are associated with the counted value received from the counter 8 so as to match one address values to two counted value. That is, they are associated so that the address value will be changed once at every time when the counted value to be supplied is counted up twice. In the second ROM 10, however, the initial counted value "0" and the initial address value are associated with each other to have three count gap between them in comparison with the case of the first ROM 9 in order to synchronize with three-bit delay to the second input data (DATA2IN) C in the elastic memory 2. On the other hand, an address value Q stored in the second ROM 10 corresponds to the second input data (DATA2IN) C, so that the address value Q is different from the address value P stored in the first ROM 9 corresponding to the first input data (DATA1IN) A. As memtioned above, the second ROM 10 changes the address value at two-bit length cycle in the order as shown Q in FIG. 5 according to counting up of the input counted value. Also the second ROM 10 produces the writing pulse (FPW) and inputs it to the elastic memory 2 at every time when the counted value is a multiple of 8, to say at eight-bit length cycle.

The address values P and Q supplied from the first and the second ROMs 9 and 10, respectively, are described more in detail referring to J through Q in FIGS. 3 and 5. To make the description clear, each address value is assumed to be a three-figure integer of decimal. The numeral in the hundred position of the figure is an area in either a first area (one hundred something) or a second area (two hundred something) in the memory. The numeral in the ten position of the figure represents a number of the channel to be stored. The numeral in the least significant position represents to which of the first and the second input data it corresponds.

FIG. 5J shows the writing address extracted from P, the actual output value of the ROM 9. FIG. 5K shows the writing address extracted from Q, the actual output value of the ROM 10. As apparent from these timing charts, the numeral in the least significant position is equal to "1" in J and P while it is equal to "2" in K and Q. The numerals in the middle position are given in the same order as for the channel of the input data. The numerals in the hundred position are alternations of "1" and "2" for every six addresses (i.e., addresses for one frame) for the addresses of both ROM 9 and ROM 10. This is because the double-buffer technique is used as the writing/reading method for the memory in the first embodiment. The double-buffer technique is a way in which the memory is divided into two areas. The first frame is written in one area at the first cycle and the second frame is written in the other area while the first frame is read out of the one area at the second cycle. With this double-buffer technique, the channels belonging to the same frame are dealt as one set while the order of the channels can be changed. Accordingly, the address areas corresponding to the channels having the identical number should be changed in number between that for the first channel and that for the second channel. This is the reason for clearing of the counter value at every twice receptions of the synchronous pulses (FP1, FP2) B and D by the counters 7 and 8, respectively.

FIG. 5L shows the reading address extracted from P, the actual output value of the ROM 9. FIG. 5M shows the reading address extracted from Q, the actual output value of the ROM 10. The numerals in the middle positions are determined according to the order of the channels at the time of production as the output data G and H. The numerals in the most and least significant positions are given in the same manner as for the writing addresses J and K.

The writing address J and the reading address L, each having a predetermined pattern, are alternated by every two-bit length and produced as the address value P, the actual output of the ROM 9. Likewise, the writing address K and the reading address M are alternated by every two-bit length and produced as the address value Q, the actual output of the ROM 10.

Turning back to FIG. 2, the second multiplier 12 receives the address values P and Q supplied from the first and the second ROMs 9 and 10, respectively, to alternate them by every four-bit length and supply them to the address input terminal 6b of the RAM 6. Accordingly, a multiplied address output of the second multiplier 12 is produced with the address values changed by every two-bit length in the order of, as shown in R in FIG. 5, the writing address value of the first input data, the reading address value of the first input data, the writing address value of the second input data and the reading address value of the second input data. As mentioned above, each of the input data A' and E' has the time lag corresponding to eight bits after the serial/parallel conversion. With this respect, the ROMs 9 and 10 produces addresses considering this time lag. This permits matching of the timing between the input data F and the address value R (as shown P, U in FIG. 5, the initial address value "101" corresponds to the counted value "8" in the first ROM 9. Also as shown Q, V in FIG. 5, the initial address value "102" corresponds to the counted value "11" in the second ROM 10.

The flip-flop 13 receives through the D input terminal 13a the data read out of the RAM 6. The flip-flop 13 also receives through the CK input terminal 13c the clock pulses supplied from the decoder 11. The flip-flop 13 produces through the output terminal 13b thereof the data on the D input terminal 13a (read data) as the output data (DATAOUT) in response to the clock pulse. Accordingly, the data is produced only when the clock is received. This prevents the input data F passed through the high-impedance control unit 5 from being produced as it is.

The decoder 11 receives the counter value of the first counter 7. The decoder 11 decodes this counter value to produce, according to a given timing, the control pulses for the RAM 6, the control signals for the high-impedance control unit 5 and the CK pulses for the flip-flop 13. Summarizing the relation of these control signal or the like, in writing the input data F, the high-impedance control unit 5 is in the low impedance status, the RAM 6 is supplied with the control pulse and the flip-flop 13 is supplied with no clock pulses. On the other hand, in reading the data stored in the RAM 6, the high-impedance control unit 5 is in the high impedance status, the RAM 6 is supplied with no control pulses and the flip-flop 13 is supplied with the clock pulse.

The signal restoring device 14 divides the output data (DATAOUT) supplied from the flip-flop 13 into a first output data (DATA1OUT) G corresponding to the first input data (DATA1IN) A and a second output data (DATA2OUT) H corresponding to the second input data (DATA2IN) C to produce them as serial signals.

The operation of the memory control device so constructed according to the second embodiment is described.

First, the first counter 7 clears the counted value and starts counting up by receiving the first synchronous pulse (FP1) B twice. As a result, the reading pulse (FPR) S is outputted from the first ROM 9. Similarly, the second counter 8 clears the counted value and starts counting up by receiving the second synchronous pulse (FP2) D twice. As a result, the writing pulse (FPW) T is outputted from the second ROM 10.

The pulse (FPR) S and pulse (FPW) T are both supplied to the elastic memory 2. In response to these inputs, the elastic memory 2 determines an amount of delay suitable for the second input data (DATA2IN) C.

On the other hand, the first input data (DATA1IN) A is converted into an 8-parallel signal (A') by the first serial/parallel converter 1. The converted data is supplied to the multiplier 4. The second input data (DATA2IN) C is subjected to synchronization in the channel level (E) with the first input data (DATA1IN) by the elastic memory 2. The second input data (DATA2IN) E is converted into an 8-parallel signal (E') by the second serial/parallel converter 2. The converted data is then supplied to the multiplier 4. The multiplier 4 converts the signals (A' and E') into a time-division multiple signal (F) altered at every four bits to supply it to the high-impedance control unit 5.

The first ROM 9 supplied with the counted value from the first counter 7 successively produces address values (P) corresponding to the counted values (U). Likewise, the second ROM 10 supplied with the counted value (V) from the second counter 8 successively produces address values (Q) corresponding to the counted values. The multiplier 4 supplied with these address values (P, Q) produces a multiplied address value (R) where these address values (P, Q) are altered by every four-bit length.

The decoder 11 supplied with the counted value from the first counter 7 sends the control pulse having the interval of for-bit length to the RAM 6 in such a manner that a single output is followed by a single stop of output. In synchronism with this, the decoder 11 supplies the control signal to the high-impedance control unit 5 such that pass of the time-division multiplied signal (F) is alternatively allowed and hindered by every two-bit length. In synchronism with this, the decoder 11 supplies the control pulse to the flip-flop 13 in such a manner that a single stop of output is followed by a single output alternately with the control pulse for the RAM 6. The RAM 6 supplied with these signals writes the channel of the first input data (DATA1IN) A in a predetermined address during the first time slot of two-bit long, and reads the channel of the first input data (DATA1IN) A according to a predetermined address during the second time slot of two-bit long. The RAM 6 writes the channel of the second input data (DATA2IN) C in a predetermined address during the third time slot of two-bit long, and reads the channel of the second input data (DATA2IN) C according to a predetermined address during the fourth time slot of two-bit long. By means of repeating the above mentioned writing/reading, all channels in one frame are written in while all channels in the frame previously written are read out. In reading, the data are read out of the memory in the different order of the channels from that of the channel in writing. As a result, the format is converted.

By means of repeating such writing/reading, the signal status on the data input and output terminal of the RAM 6 becomes as shown in I in FIG. 5. The flip-flop 13 selects only the read data of these signals to produce it to the signal restoring device 14. The signal restoring device 14 divides the data into the first output signal (DATA1OUT) G and the second output signal (DATA2OUT) H to produce them in the form of serial signals.

As mentioned above, in the memory control device according to the second embodiment, a plurality of input data (DATAIN) A, C are multiplied with uniqueness of the individual phases being kept to some degree. In addition, the common hardware, i.e., the high-impedance control unit 5, the RAM 6 and the flip-flop 13 are used for converting the format, following which the data are separated from each other. Accordingly, no enlarged scale of hardware is required. In addition, the format conversion processing can be made even on a data having a specific phase due to various reasons and it is not necessary to return its phase to the original phase after separation. In the second embodiment, when the input data having the phase difference that is not similar to that shown in FIG. 4, the association between the counted value V and address value Q in the second ROM 10 may be changed. The second multiplier 12 is capable of multiplying two address values regardless of how the timing is changed.

Third Embodiment

In the above mentioned second embodiment, the amount of delay is fixed after the amount of delay required for synchronization in the channel level is determined and the second counter 8 or the like is set. As a result, synchronization cannot be achieved when the input data having a difference phase is received. More specifically, the initial setting can be used for the input data having the phase shifted by 8×α relative to the phase of the input data that is set first. However, the initial setting is invalid or useless for the data other than the data of the type described. The third embodiment is a further improvement of the second embodiment. More specifically, this embodiment is directed to a memory control device that is capable of synchrnoizing the data by means of changing the amount of delay regardless of the phase of the input data.

Figure 6:
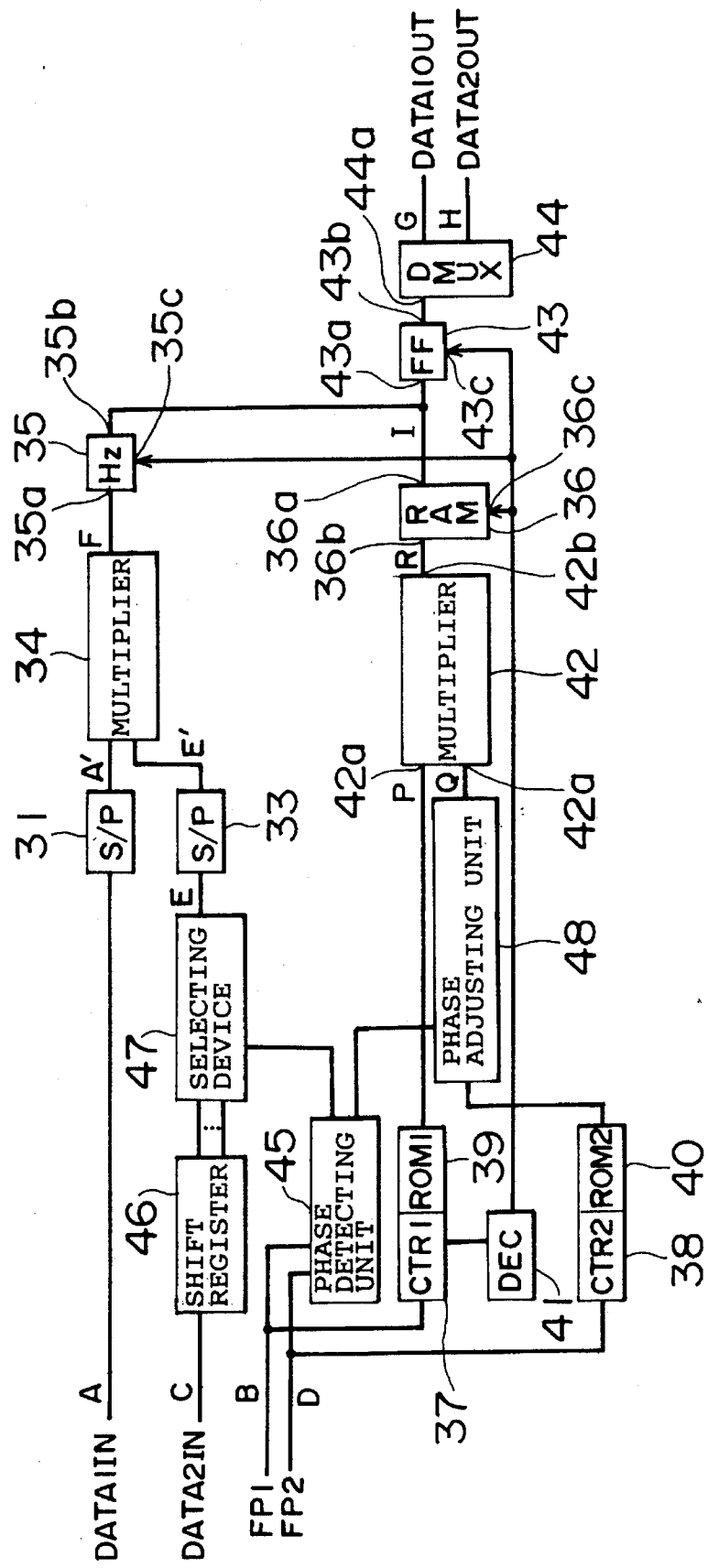
FIG. 6 is a block diagram showing a structure of a third embodiment of the present invention.

FIG. 6 is a block diagram showing a structure of a memory control device according to the third embodiment of the present invention. In the third embodiment, in place of the elastic memory 2 in the second embodiment, the following are provided; a phase detecting section 45 as a phase difference detecting means for receiving the first synchronous pulse (FP1) B and the second synchronous pulse (FP2) D, a shift register 46 as a delaying means wherein the second input data (DATA2IN) C is a input signal, and a selecting device 47 connected with the phase detecting unit 45. In addition, a phase adjusting unit 48 connected with the phase detecting section 45 intervenes between the second ROM 40 and the second multiplier 42. Further, because of these constitutions, the function of the first and the second ROMs 39 and 40 is a little different from that of the second enbodiment.

First, connecting relation between the individual brocks of the memory control device according to the third embodiment is described on the basis of FIG. 6.

The first input data (DATA1IN) A is supplied directly to a first serial/parallel converter 31 as a serial and parallel conversion means. On the other hand, the second input data (DATA2IN) C is supplied to a second serial/parallel converter 33 as a serial and parallel conversion means through a shift register 46 and a selecting device as a delaying means. These first and second serial/parallel converters 31 and 33 are connected to a first multiplier 34 as a multiplier means. The first multiplier 34 is connected in turn to a data input terminal 35a of a high-impedance control unit 35. An output terminal 35b of the high-impedance control unit 35 is connected to a data input and output terminal 36a of a random access memory (RAM) 36 as a memory means.

On the other hand, first synchronous pulses (FP1) B synchronizing with headers of the individual frames of the first input data (DATA1IN) A are supplied to the phase detector 45 and a first counter 37. Likewise, second synchronous pulses (FP2) D synchronizing with the headers of the individual frames of the second input data (DATA2IN) C are supplied to the phase detector 45 and a second counter 38.

The phase detector 45 is connected to the selecting circuit 47 and phase adjusting section 48.

The first counter 37 is connected to the first ROM 39 as a writing and reading address designating means and the decoder 41. The second counter 38 is only connected to the second ROM 40 as a writing and reading address designating means.

The first ROM 39 is directly connected to an input terminal 42a of a second multiple circuit 42. The second ROM 40 is connected to the input terminal 42a of the second multiplier 42 through the phase adjusting unit 48. An output terminal 42b of the second multiplier 42 is connected to an address input terminal 36b of the RAM 36.

The decoder 41 is connected to a control pulse input terminal 36c of the RAM 36, a control terminal 35c of the high-impedance control unit 35 and a CK input terminal 43c of a flip-flop 43. D input terminal 43a of the flip-flop 43 is connected to the data input and output terminal 36a of the RAM 36. An output terminal 43b of the flip-flop 43 is connected to an input terminal 44a of a signal restoring device 44 as a restoring means.

Next, functions of the individual blocks in FIG. 6 are described in conjunction with timing charts shown in FIGS. 4 and 5 (except for S and T).

First, the phase detector 15 receives the first synchronous pulses (FP1) B and the second synchronous pulses (FP2) D. The phase detector 15 detects a phase difference between the first and the second synchronous pulses (FP1, FP2) B, D being received. According to this phase difference, the phase detector 15 detects a phase difference between the input data (DATA1IN) A and the input data (DATA2IN) C.

The shift register 46 is formed of flip-flops connected in multiple stages as well known in the art. Accordingly, a delay signal having an arbitrary amount of delay can be obtained by means of selecting an output of one of the flip-flops.

The selecting device 47 receives a phase difference detection signal supplied from the phase detector 45. The selecting device 47 then selects, as the output in the shift register 46, the output of either one of the flip-flops having the amount of delay required for cancelling the phase difference. The term "phase difference" used herein means the phase difference in the channel level as in the case of the second embodiment. The selecting device 47 transmits the extracted delayed second input data (DATA2IN) E to the second serial/parallel converter 33.

The first serial/parallel converter 31 has a function of converting a signal format of each channel of the first input data (DATA1IN) A. More specifically, the first serial/parallel converter 31 converts a signal format formed as a serial signal of eight bits into an eight-bit parallel signal A' on eight parallel signal lines. Each channel of the parallel signal after conversion has an eight-bit length at the time when it is produced from the first serial/parallel converter 31. To convert the eight-bit serial signal into the parallel signal can be made only after the first serial/parallel converter 31 takes all eight-bit signals. Accordingly, a time lag equivalent to eight bits (which means the same time interval of eight bits in the input data A; same as below) is caused between before and after the conversion.

The second serial/parallel converter 33 has the same function as the first serial/parallel converter 31. A timing chart of the converted input data (DATA2IN) is shown in E' in FIG. 5.

The first multiplier 34 receives the first input data (DATA1IN) A' and the second input data (DATA2IN) E', both in the parallel format, to perform the time-division multiplying operation on these data to produce them with a four-bit length. Accordingly, the signal length of each channel at that time is the four-bit length. A multiplied output signal is shown in F in FIG. 4.

The high-impedance control unit 35 changes the impedance to the input data F in response to the control pulses supplied from the decoder 41, with which the high-impedance control unit 35 controls passage of the input data. More specifically, in writing the input data F into the RAM 36, the high-impedance control unit 35 lowers its impedance to allow writing of the input data F into the RAM 36. On the other hand, in reading the input data F out of the RAM 36, the high-impedance control unit 35 increases its impedance to hinder passage of the input data F. Accordingly, in reading the data stored in the RAM 36, this prevents the input data F and the data read out of the RAM 36 (hereinafter, referred to as a "read data") from being incorporated with each other at an section between the RAM 36 and the flip-flop 43. In other words, the third embodiment switches the writing status and reading status of the RAM 36 by two-bit length for each, and data for one channel is written or read at every switching of the status. Accordingly, the high-impedance control unit 35 switches by two-bit length the high and low impedance status (see I in FIG. 5).

The RAM 36 stores the input data F(I) received through its data input and output terminal 36a according to the writing address. The writing address is an address transmitted from the second multiplier 42, indicating writing position in the RAM 36. The RAM 36 supplies the stored data to the data input and output terminal 6a according to the reading address transmitted from the second multiplier 42. The reading address is an address indicating a reading position in the RAM 36. An address map of the RAM 36 is shown in FIG. 3. The RAM 36 performs the writing operation in synchronism with the control pulses supplied from the decoder 41. In this embodiment, as mentioned above, the writing and reading status are switched by every two-bit length. Accordingly, the signal status on the signal line between the RAM 36 and the flip-flop 43 is switched alternatively between the input signal (IN) and the output signal (OUT) as shown in I in FIG. 5.

At every time when receiving a first synchronous pulse (FP1) B twice, the first counter 37 clears a counted value and starts counting up from "0" at a one-bit length cycle and transmits the counted value to the ROM 39 (See U in FIG. 5).

The first ROM 39 stores various address values. The first ROM 39 receives the counted value from the counter 37 and, in response to this, produces a specific address value which is related to the counted value so as to match one address value to two counted value. The first ROM 9 thus changes the address values to be produced according to a given order in response to counting up of the counted value supplied. More specifically, the address values are changed at the two-bit length cycle according to the order shown in P FIG. 5.

The second counter 38 has almost the same function as the first counter 37. Also, the second ROM 40 has a function similar to the first ROM 39. However, the stored address value Q corresponds to the second input data (DATA1IN) C. Therefore, the address value Q is different from the address value P stored in the first ROM 39 corresponding to the first input data (DATA1IN).

The phase adjusting unit 48 receives the address value supplied from the second ROM 40 and the phase difference detecting signal supplied from the phase detector 45. The phase adjusting unit 48 delays this address value by an amount required for cancelling the phase difference detected by the phase detector 45 to supply it to the multiplier 42. In the third embodiment, the amount of delay of the address value is thus determined according to the detected phase difference. Accordingly, a function for making a three-count phase difference between the initial counted value and the initial address value is not necessary to be provided with the second ROM 40, differently from the second embodiment. Therefore, in the third embodiment, the constitution of the second ROM 40 may be the same as that of the first ROM 39.

The second multiplier 42 receives the address value P supplied from the first ROM 39 and the address value Q supplied from the second ROM 40 where the phase is adjusted by the phase adjusting unit 48, respectively, to alternate them by every four-bit length and supply them to the address input terminal 36b of the RAM 36. Accordingly, a multiplied address output of the second multiplier 12 is produced with the address values changed by every two-bit length in the order of, as shown in R in FIG. 5, the writing address value of the first input data, the reading address value of the first input data, the writing address value of the second input data and the reading address value of the second input data. As mentioned above, each of the input data A' and E' has the time lag corresponding to eight bits after the serial/parallel conversion. With this respect, the ROMs 39 and 40 produces addresses considering this time lag. This permits matching of the timing between the input data F and the address value R.

The flip-flop 43 receives through the D input terminal 43a the data read out of the RAM 36. The flip-flop 43 also receives through the CK input terminal 43c the clock pulses supplied from the decoder 41. The flip-flop 43 produces through the output terminal 43b thereof the data on the D input terminal 43a (read data) as the output data (DATAOUT) in response to the clock pulse. Accordingly, the data is produced only when the clock is received. This prevents the input data F passed through the high-impedance control unit 5 from being produced as it is.

The decoder 41 receives the counter value of the first counter 37. The decoder 41 decodes this counter value to produce, according to a given timing, the control pulses for the RAM 36, the control signals for the high-impedance control unit 35 and the CK pulses for the flip-flop 43. Summarizing the relation of these control signal or the like, in writing the input data F, the high-impedance control unit 35 is in the low impedance status, the RAM 36 is supplied with the control pulse and the flip-flop 43 is supplied with no clock pulses. On the other hand, in reading the data stored in the RAM 36, the high-impedance control unit 35 is in the high impedance status, the RAM 6 is supplied with no control pulses and the flip-flop 43 is supplied with the clock pulse.

The signal restoring device 44 divides the output data (DATAOUT) supplied from the flip-flop 43 into a first output data (DATA1OUT) G corresponding to the first input data (DATA1IN) A and a second output data (DATA2OUT) H corresponding to the second input data (DATA2IN) C to produce them as serial signals.

The operation of the memory control device so constructed according to the third embodiment is described.

First, the first input data (DATA1IN) A received is converted into an eight-parallel signal (A') by the first serial/parallel converter 31. The converted signal is supplied to the first multiplier 34. The second input data (DATA2IN) C is supplied to the shift register 46. The second input data (DATA2IN) C is then transferred on the plurality of flip-flops constructing the shift register 46 with being delayed by one bit.

On the other hand, the phase detector 45 receives the first synchronous pulse (FP1) B and the second synchronous pulse (FP2) D to detect the phase difference therebetween. In the example shown in FIG. 4, the phase detector 45 detects that the phase of the input data C is a three-bit advanced phase in the channel level relative to the phase of the first input data A. The phase detector 45 transmits the detected result to the selecting device 47 and the phase adjusting unit 48.

The selecting device 47 extracts the output of either one of the flip-flops in the shift register 46. The output of this flip-flop accompanies a certain amount of delay. The amount of delay corresponds to the phase difference indicated by the phase detected result supplied from the phase detector 45 to the selecting device 47. In the example shown in FIG. 4, the phase difference of three bits is notified by the phase detector 45, the selecting device 47 extracts an output (E) having the amount of delay of three bits. The second input data (DATA2IN) E so synchronized with the first input data (DATA1IN) A is converted into an eight-parallel signal (E') by the second serial/parallel converter 33. The second input data (DATA2IN) E' is supplied to the first multiplier 34. The first multiplier 34 converts the signals (A' and E') into a time-division multiple signal (F) where these signals are alternatively produced by every four-bit length. The time-division multiple signal (F) is supplied to the high-impedance control unit 35.

On the other hand, the first counter 37 clears the counted value and starts the counting up operation in response to twice reception of the first synchronous pulses (B). The cycle of counting up corresponds to the two-bit length. The second counter 38 starts the counting up in the same manner as described above in response to twice reception of the second synchronous pulses (D). The first ROM 39 supplied with the counted values from the first counter 37 successively produces the address values (P) corresponding to the counted values. Similarly, the second ROM 40 supplied with the counted value from the second counter 38 successively produces the address values (Q) corresponding to the counted values. Differently from that shown in FIG. 4, the phase of a change cycle on the address values (Q) of the second ROM 40 in the third embodiment has the phase difference relative to the phase of a change cycle of the address values (P) of the first ROM 39, and they are not synchronized with each other.

The phase adjusting unit 48 delays the address values (Q) of the second ROM 40 depending on the phase difference represented by the phase detected result obtained by the phase detector 45. As a result, the phase adjusting unit 48 synchronizes address values (Q) of the second ROM 40 with the address values (P) of the first ROM 39. Receiving these address values (P, Q), the second multiplier 42 produces a multiplied address value (R) where address values (P, Q) are alternated by two-bit length.

Subsequent operation in the third embodiment is similar to those in the second embodiment, of which description is omitted.

As mentioned above, according to the memory control device of the third embodiment, the same effect can be obtained as in the second embodiment. In addition, in the third embodiment, synchronization can readily be achieved even on the input signals having any phase difference.

In addition, the phase matching for the address value (Q) in the third embodiment is performed at the output side of the ROM 40. On the contrary, it is also possible to synchronize the second synchronous pulse (FP2) D before being supplied to the second counter 38 by means of disposing the phase adjusting unit 48 before the second counter 38.

Fourth Embodiment

Figure 7:
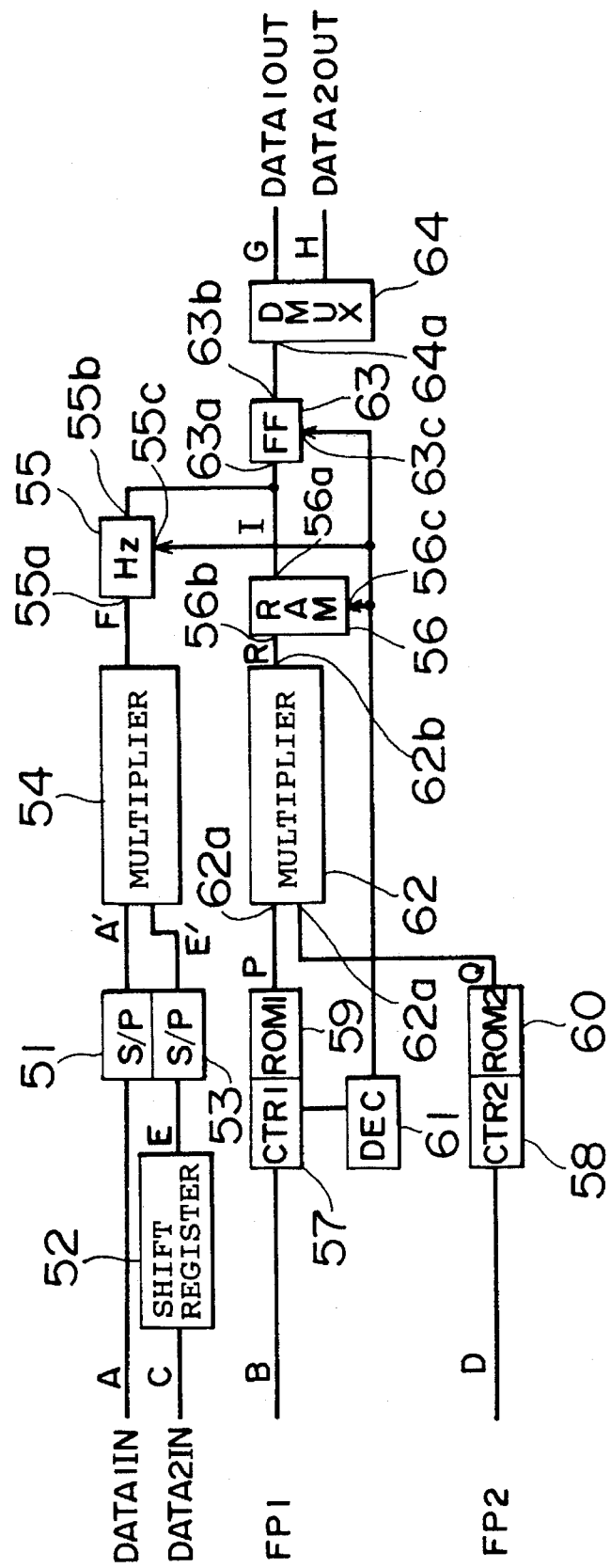
FIG. 7 is a block diagram showing a structure of a fourth embodiment of the present invention.

FIG. 7 is a block diagram showing a structure of a memory control device according to a fourth embodiment of the present invention. The fourth embodiment has the same constitution as the second embodiment except for using a shift register 52 in place of the elastic memory 2 as a delaying means, and the first and second memory 59 and 60 having no function for producing the pulses (PFR, PFW) S and T.

First, connection of the individual blocks in the memory control device according to the fifth embodiment is described in conjunction with FIG. 7.

The first input data (DATA1IN) A is supplied directly to a first serial/parallel converter 51 as a serial and parallel conversion means. On the other hand, the second input data (DATA2IN) C is supplied to a second serial/parallel converter 53 as a serial and parallel conversion means through an elastic memory 52 as a delaying means. These first and second serial/parallel converters 51 and 53 are connected to a first multiplier 54 as a multiplier means. The first multiplier 54 is connected in turn to a data input terminal 55a of a high-impedance control unit 55. An output terminal 55b of the high-impedance control unit 55 is connected to a data input and output terminal 56a of a random access memory (RAM) 56 as a memory means.

On the other hand, first synchronous pulses (FP1) B synchronizing with headers of the individual frames of the first input data (DATA1IN) A are supplied to a first counter 57. Likewise, second synchronous pulses (FP2) D synchronizing with the headers of the individual frames of the second input data (DATA2IN) C are supplied to a second counter 58.

The first counter 57 is connected to a first ROM 59 as a writing and reading adress designating means and a decoder 61. The second counter 58 is connected to a second ROM 60 as a writing and reading adress designating means. The first and the second ROMs 59 and 60 are connected to input terminals 62a of a second multiplier 62 as a multiplier means. An output terminal 62b of the second multiplier 62 is connected to an address input terminal 56b of the RAM 56.

The decoder 61 is connected to a control pulse input terminal 56c of the RAM 56, a control terminal 55c of the high-impedance control unit 55 and a CK input terminal 63c of a flip-flop 63. D input terminal 63a of the flip-flop 63 is connected to the data input and output terminal 56a of the RAM 56. An output terminal 63b of the flip-flop 63 is connected to an input terminal 64a of a signal restoring device 64 as a restoring means.

Next, functions of the individual blocks in FIG. 7 are described in conjunction with timing charts shown in FIGS. 4 and 5 (except for S and T).

A Shift register 52 is composed on the basis of the constitution where the flip-flop is connected to many steps, similarly to the shift register 46 in the third embodiment. In the fourth embodiment, however, delaying amount to the second input data (DATA2IN) C is fixed. Accordingly, the number of the flip-flop steps only corresponds to the fixed delaying amount. Thus, in the case shown in FIG. 4, the number of steps is set so that the second input data (DATA2IN) C may be delayed by three bit in order to synchronize both input data (DATA1IN and DATA2IN) A and C at the channel level.

The first serial/parallel converter 51 has a function of converting a signal format of each channel of the first input data (DATA1IN) A. More specifically, the first serial/parallel converter 1 converts a signal format formed as a serial signal of eight bits into an eight-bit parallel signal A' on eight parallel signal lines. Each channel of the parallel signal after conversion has an eight-bit length at the time when it is produced from the first serial/parallel converter 51. To convert the eight-bit serial signal into the parallel signal can be made only after the first serial/parallel converter 51 takes all eight-bit signals. Accordingly, a time lag equivalent to eight bits (which means the same time interval of eight bits in the input data A; same as below) is caused between before and after the conversion. Because of this, F in FIG. 4 is delayed by eight bits from A in the same figure. A timing chart on the converted input data (DATA1IN) is shown in A' in FIG. 5.

The second serial/parallel converter 53 has the same function as the first serial/parallel converter 51. A timing chart of the converted input data (DATA2IN) is shown in E' in FIG. 5.

The first multiplier 54 receives the first input data (DATA1IN) A' and the second input data (DATA2IN) E', both in the parallel format, to perform the time-division multiplying operation on these data to produce them with a four-bit length. Accordingly, the signal length of each channel at that time is the four-bit length. A multiplied output signal is shown in F in FIG. 4.

The high-impedance control unit 55 changes the impedance to the input data F in response to the control pulses supplied from the decoder 61, with which the high-impedance control unit 55 controls passage of the input data. More specifically, in writing the input data F into the RAM 56, the high-impedance control unit 55 lowers its impedance to allow writing of the input data F into the RAM 56. On the other hand, in reading the input data F out of the RAM 56, the high-impedance control unit 55 increases its impedance to hinder passage of the input data F. Accordingly, in reading the data stored in the RAM 56, this prevents the input data F and the data read out of the RAM 56 (hereinafter, referred to as a "read data") from being incorporated with each other at an section between the RAM 56 and the flip-flop 63. In other words, the fourth embodiment switches the writing status and reading status of the RAM 56 by two-bit length for each, and data for one channel is written or read at every switching of the status. Accordingly, the high-impedance control unit 55 switches by two-bit length the high and low impedance status (see I in FIG. 5). The RAM 56 stores the input data F(I) received through its data input and output terminal 56a according to the writing address. The writing address is an address transmitted from the second multiplier 62, indicating writing position in the RAM 56. The RAM 56 supplies the stored data to the data input and output terminal 56a according to the reading address transmitted from the second multiplier 62. The reading address is an address indicating a reading position in the RAM 56. An address map of the RAM 56 is shown in FIG. 3. The RAM 56 performs the writing operation in synchronism with the control pulses supplied from the decoder 61. In this embodiment, as mentioned above, the writing and reading status are switched by every two-bit length. Accordingly, the signal status on the signal line between the RAM 56 and the flip-flop 63 is switched alternatively between the input signal (IN) and the output signal (OUT) as shown in I in FIG. 5.

At every time when receiving a first synchronous pulse (FP1) B twice, the first counter 57 clears a counted value and starts counting up from "0" at a one-bit length cycle and transmits the counted value to the ROM 59 (See U in FIG. 5).

The first ROM 59 stores various address values. The address values are associated with the counted value received from the counter 57 so as to match onw address values to two counted value. That is, they are associated so that the address value will be changed once at every time when the counted value to be supplied is counted up twice. The first ROM 59 thus changes the address values to be produced according to a given order in response to counting up of the counted value supplied. More specifically, the address values are changed at the two-bit length cycle according to the order shown in P in FIG. 5.

Similarly, at every time when receiving a second synchronous pulse (FP2) D twice, the second counter 58 clears a counted value and starts counting up from "0" at a one-bit length cycle and transmits the counted value to the second ROM 60 (See V in FIG. 5).

The second ROM 60 stores various address values. The address values are associated with the counted value received from the counter 58 so as to match one address values to two counted value. That is, they are associated so that the address value will be changed once at every time when the counted value to be supplied is counted up twice. In the second ROM 60, however, the initial counted value "0" and the initial address value "102" are associated with each other to have three count gap between them in comparison with the case of the first ROM 9 in order to synchronize with three-bit delay to the second input data (DATA2IN) C in the shift register 52. On the other hand, an address value Q stored in the second ROM 60 corresponds to the second input data (DATA2IN) C, so that the address value Q is different from the address value P stored in the first ROM 59 as the correspondence to the first input data (DATA1IN) A. For the reason as mentioned above, the second ROM 60 changes the address value at two-bit length cycle in the order as shown Q in FIG. 5 according to counting up of the input counted value.

The second multiplier 62 receives the address values P and Q supplied from the first and the second ROMs 59 and 60, respectively, to alternate them by every four-bit length and supply them to the address input terminal 56b of the RAM 56. Accordingly, a multiplied address output of the second multiplier 62 is produced with the address values changed by every two-bit length in the order of, as shown in R in FIG. 5, the writing address value of the first input data, the reading address value of the first input data, the writing address value of the second input data and the reading address value of the second input data. As mentioned above, each of the input data A' and E' has the time lag corresponding to eight bits after the serial/parallel conversion. With this respect, the ROMs 59 and 60 produces addresses P, Q considering this time lag. This permits matching of the timing between the input data F and the address value R (as shown P, U in FIG. 5, the initial address value "101" corresponds to the counted value "8" in the first ROM 59. Also as shown Q, V in FIG. 5, the initial address value "102" corresponds to the counted value "11" in the second ROM 60.

The flip-flop 63 receives through the D input terminal 63a the data read out of the RAM 56. The flip-flop 63 also receives through the CK input terminal 63c the clock pulses supplied from the decoder 61. The flip-flop 63 produces through the output terminal 63b thereof the data on the D input terminal 63a (read data) as the output data (DATAOUT) in response to the clock pulse. Accordingly, the data is produced only when the clock is received. This prevents the input data F passed through the high-impedance control unit 55 from being produced as it is.

The decoder 61 receives the counter value of the first counter 57. The decoder 61 decodes this counter value to produce, according to a given timing, the control pulses for the RAM 56, the control signals for the high-impedance control unit 55 and the CK pulses for the flip-flop 63. Summarizing the relation of these control signal or the like, in writing the input data F, the high-impedance control unit 55 is in the low impedance status, the RAM 56 is supplied with the control pulse and the flip-flop 63 is supplied with no clock pulses. On the other hand, in reading the data stored in the RAM 56, the high-impedance control unit 55 is in the high impedance status, the RAM 56 is supplied with no control pulses and the flip-flop 63 is supplied with the clock pulse.

The signal restoring device 64 divides the output data (DATAOUT) supplied from the flip-flop 63 into a first output data (DATA1OUT) G corresponding to the first input data (DATA1IN) A and a second output data (DATA2OUT) H corresponding to the second input data (DATA2IN) C to produce them as serial signals.

The operation of the memory control device so constructed according to the fourth embodiment is described.

First, the first counter 57 clears the counted value and starts counting up by receiving the first synchronous pulse (FP1) B twice. Similarly, the second counter 58 clears the counted value and starts counting up by receiving the second synchronous pulse (FP2) D twice.

On the other hand, the first input data (DATA1IN) A is converted into an 8-parallel signal (A') by the first serial/parallel converter 51. The converted data is supplied to the multiplier 54. The second input data (DATA2IN) C is subjected to synchronization in the channel level with the first input data (DATA1IN) A by the shift register 52 (E). The second input data (DATA2IN) E is converted into an 8-parallel signal (E') by the second serial/parallel converter 53. The converted data (E') is then supplied to the multiplier 54. The multiplier 54 converts the signals (A' and E') into a time-division multiple signal (F) altered at every four bits to supply it to the high-impedance control unit 55.

The first ROM 59 supplied with the counted value from the first counter 57 successively produces address values (P) corresponding to the counted values (U). Likewise, the second ROM 10 supplied with the counted value (V) from the second counter 58 successively produces address values (Q) corresponding to the counted values. The second multiplier 62 supplied with these address values (P, Q) produces a multiplied address value (R) where these address values (P, Q) are altered by every four-bit length.

A description of the operations after that is omitted, because they are exactly the same as those in the second embodiment.

As mentioned above, according to the memory control device in the fourth embodiment, the same effect as that of the second embodiment can be obtained by a simple constitution.

Fifth Embodiment

Figure 8:
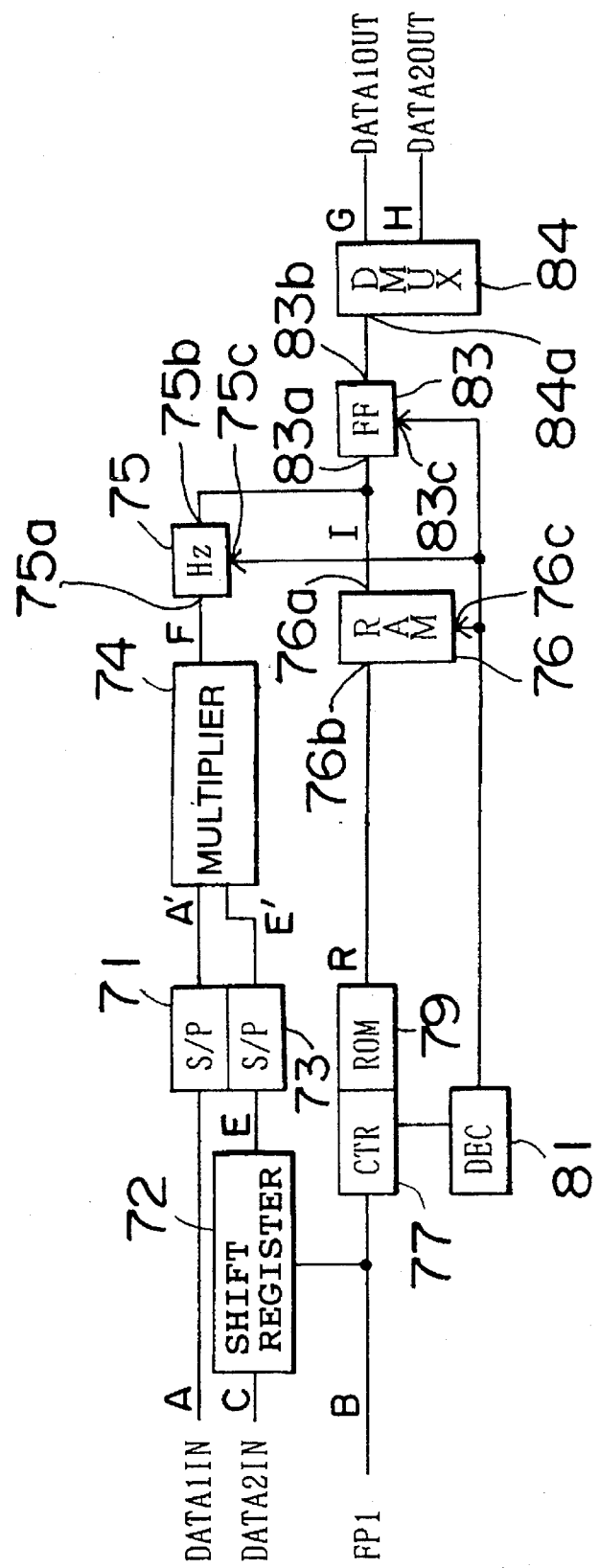
FIG. 8 is a block diagram showing a structure of a fifth embodiment of the present invention.
Figure 9:
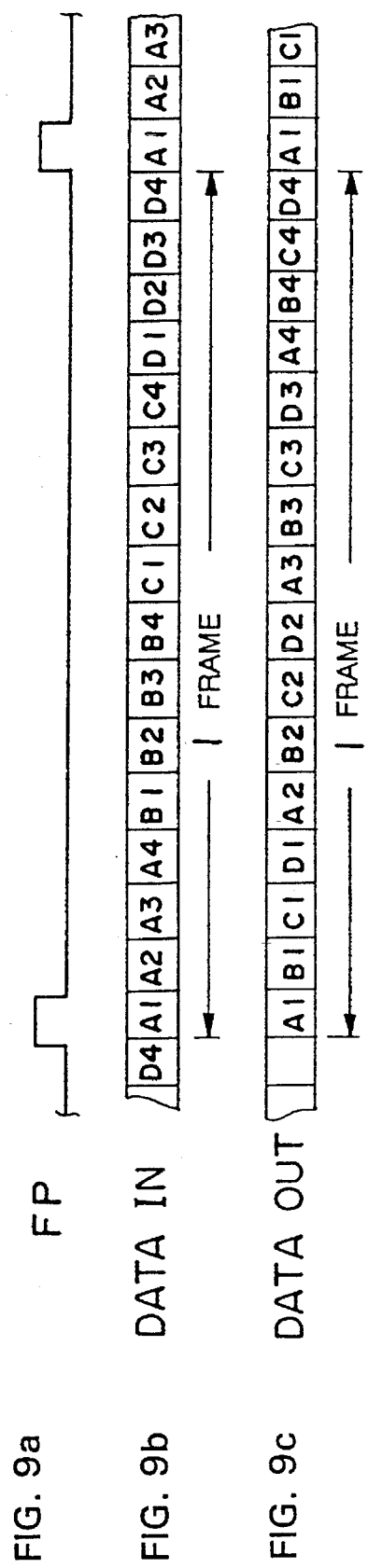
FIGS. 9a–9c are views for use in describing an example of format conversion.
Figure 10:
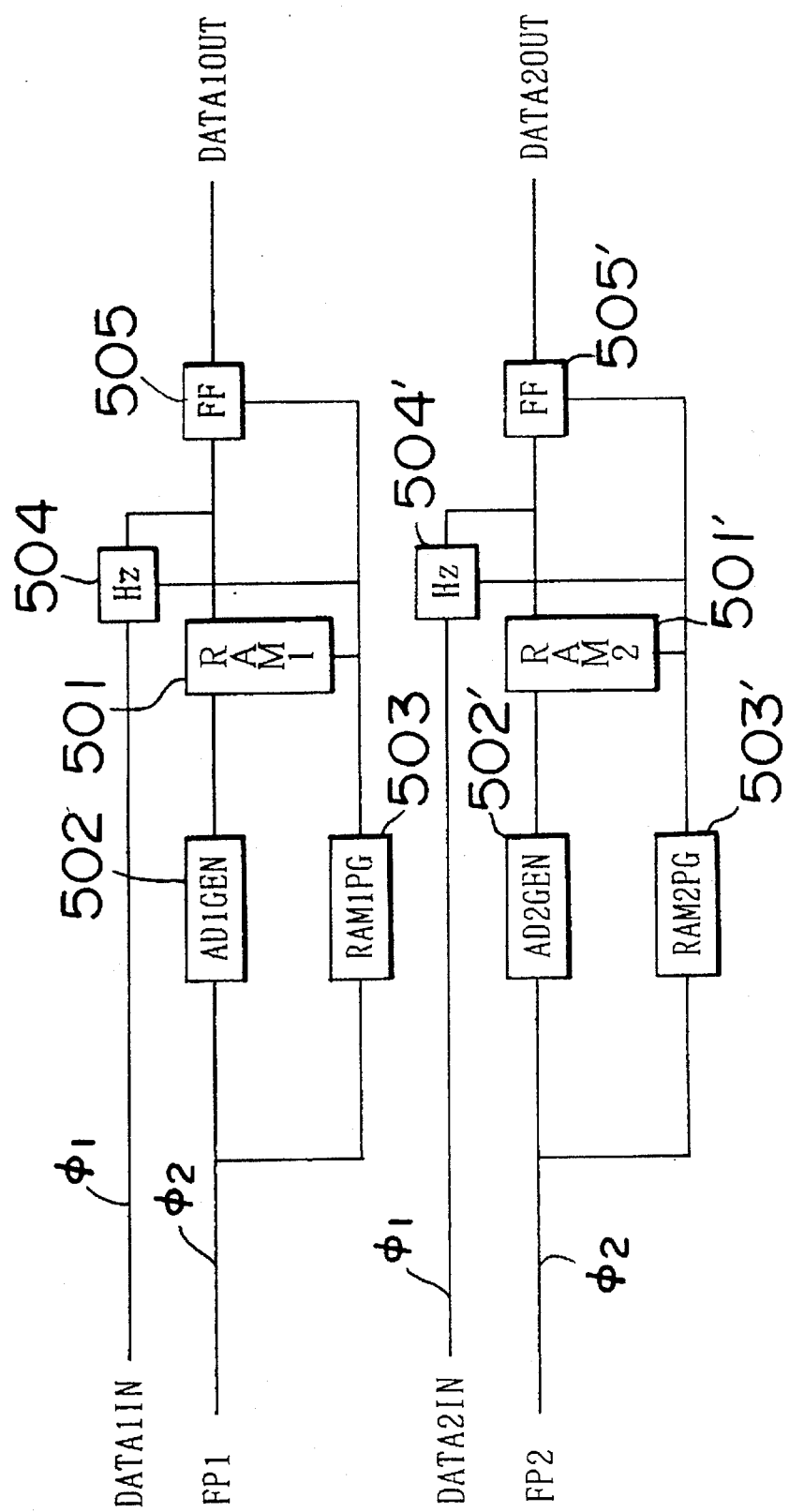
FIG. 10 is a block diagram of a conventional device.

FIG. 8 is a block diagram showing a structure of a memory control device according to a fifth embodiment of the present invention. The constitution of the fifth embodiment is different from that of the fourth embodiment in having only one counter 77 and only one ROM 79, and in not having the second multiplier 62. As a result, the pattern of the address value stored in the ROM 79 is different from that of the third embodiment.

First, connection of the individual blocks in the memory control circuit according to the fifth embodiment is described in conjunction with FIG. 8.

The first input data (DATA1IN) A is supplied directly to a first serial/parallel converter 71 as a serial and parallel conversion means. On the other hand, the second input data (DATA2IN) C is supplied to a second serial/parallel converter 3 as a serial and parallel conversion means through a shift register 72 as a delaying means. These first and second serial/parallel converters 71 and 73 are connected to a first multiplier 74 as a multiplier means. The first multiplier 74 is connected in turn to a data input terminal 75a of a high-impedance control unit 75. An output terminal 75b of the high-impedance control unit 75 is connected to a data input and output terminal 76a of a random access memory (RAM) 76 as a memory means.

On the other hand, first synchronous pulses (FP1) B synchronizing with headers of the individual frames of the first input data (DATA1IN) A are supplied to a counter 77. The counter 77 is connected to a ROM 79 as a writing and reading adress designating means and a decoder 81. The ROM 79 is connected to the address input terminal 76b of the RAM 76.

The decoder 81 is connected to a control pulse input terminal 76c of the RAM 76, a control terminal 75c of the high-impedance control unit 75 and a CK input terminal 83c of a flip-flop 83. D input terminal 83a of the flip-flop 83 is connected to the data input and output terminal 76a of the RAM 76. An output terminal 83b of the flip-flop 83 is connected to an input terminal 84a of a signal restoring device 84 as a restoring means.

Next, functions of the individual blocks in FIG. 8 are described in conjunction with timing charts shown in FIGS. 4 and 5 (except for D, P, Q, S, T, and V).

The shift register 72 is composed on the basis of the constitution where the flip-flop is connected to many steps, similarly to the shift register 46 in the second embodiment. In the fifth embodiment, however, delaying amount to the second input data (DATA2IN) C is fixed, because it is a premise that the phase difference between both input data (DATA1IN and DATA2IN) A and C is already known. Therefore, the number of the flip-flop steps only corresponds to the fixed delaying amount. Thus, in the case shown in FIG. 4, the number of steps is set so that the second input data (DATA2IN) C may be delayed by three bit in order to synchronize both input data (DATA1IN and DATA2IN) A and C at the channel level.

The first serial/parallel converter 71 has a function of converting a signal format of each channel of the first input data (DATA1IN) A. More specifically, the first serial/parallel converter 71 converts a signal format formed as a serial signal of eight bits into an eight-bit parallel signal A' on eight parallel signal lines. Each channel of the parallel signal after conversion has an eight-bit length at the time when it is produced from the first serial/parallel converter 71. To convert the eight-bit serial signal into the parallel signal can be made only after the first serial/parallel converter 71 takes all eight-bit signals. Accordingly, a time lag equivalent to eight bits (which means the same time interval of eight bits in the input data A; same as below) is caused between before and after the conversion. Because of this, F in FIG. 4 is delayed by eight bits from A in the same figure. A timing chart on the converted input data (DATA1IN) A is shown in A' in FIG. 5.

The second serial/parallel converter 73 has the same function as the first serial/parallel converter 71. A timing chart of the converted input data (DATA2IN) C is shown in E' in FIG. 5.

The first multiplier 74 receives the first input data (DATA1IN) A' and the second input data (DATA2IN) E', both in the parallel format, to perform the time-division multiplying operation on these data to produce them with a four-bit length. Accordingly, the signal length of each channel at that time is the four-bit length. A multiplied output signal is shown in F in FIG. 4.

The high-impedance control unit 75 changes the impedance to the input data F in response to the control pulses supplied from the decoder 81, with which the high-impedance control unit 75 controls passage of the input data. More specifically, in writing the input data F into the RAM 76, the high-impedance control unit 75 lowers its impedance to allow writing of the input data F into the RAM 76. On the other hand, in reading the input data F out of the RAM 76, the high-impedance control unit 75 increases its impedance to hinder passage of the input data F. Accordingly, in reading the data stored in the RAM 76, this prevents the input data F and the data read out of the RAM 76 (hereinafter, referred to as a "read data") from being incorporated with each other at an section between the RAM 76 and the flip-flop 83. In other words, the fifth embodiment switches the writing status and reading status of the RAM 76 by two-bit length for each, and data for one channel is written or read at every switching of the status. Accordingly, the high-impedance control unit 75 switches by two-bit length the high and low impedance status (see I in FIG. 5).

The RAM 76 stores the input data F(I) received through its data input and output terminal 76a according to the writing address transmitted from the ROM 79. The writing address is an address indicating writing position in the RAM 76. The RAM 76 supplies the stored data to the data input and output terminal 76a according to the reading address. The reading address is an address indicating a reading position in the RAM 76. An address map of the RAM 76 is shown in FIG. 3. The RAM 76 performs the writing operation in synchronism with the control pulses supplied from the decoder 81. In this embodiment, as mentioned above, the writing and reading status are switched by every two-bit length. Accordingly, the signal status on the signal line between the RAM 76 and the flip-flop 83 is switched alternatively between the input signal (IN) and the output signal (OUT) as shown in I in FIG. 5.

On the other hand, the first synchronous pulse (FP1) B synchronizing with the head of each flame of the first input data (DATA1IN) A is supplied to the counter 77. At every time when receiving a first synchronous pulse (FP1) B twice, the counter 77 clears a counted value and starts counting up from "0" at a one-bit length cycle and transmits the counted value to the ROM 79 (See U in FIG. 5).

The first ROM 79 stores various address values. The address values are associated with the counted value received from the counter 77 so as to match one address values to two counted value. That is, they are associated so that the address value will be changed once at every time when the counted value to be supplied is counted up twice. The first ROM 79 thus changes the address values to be produced according to a given order in response to counting up of the counted value supplied. More specifically, it produces in order of the address values are changed at the two-bit length cycle according to the order shown in R in FIG. 5. Thus, ROM 79 in the fifth embodiment produces the address value, changing it every two bit according to the same order as the address value R multiplied by the second multiplier 62 in the fourth embodiment. More specifically, the writing address value of the first input data, the reading address value of the first input data, the writing address value of the second input data and the reading address value of the second input data. As mentioned above, each of the input data A' and E' has the time lag corresponding to eight bits after the serial/parallel conversion. With this respect, the ROM 79 produces addresses considering this time lag. This permits matching of the timing between the input data F and the address value R (as shown by R, U in FIG. 5, the initial address value "101" corresponds to the counted value "8" in the first ROM 9.)

ROM 79 produces the address output R as memtioned above to the address input terminal 76b in RAM 76.

In the fifth embodiment, the second synchronous pulse (FP2) D is not used.

The flip-flop 83 also receives through the CK input terminal 83c the clock pulses supplied from the decoder 81. The flip-flop 83 produces through the output terminal 83b thereof the data on the D input terminal 83a (read data) as the output data (DATAOUT) in response to the clock pulse. Accordingly, the data is produced only when the clock is received. This prevents the input data F passed through the high-impedance control unit 75 from being produced as it is.

The decoder 81 receives the counter value of the first counter 77. The decoder 81 decodes this counter value to produce, according to a given timing, the control pulses for the RAM 76, the control signals for the high-impedance control unit 75 and the CK pulses for the flip-flop 83. Summarizing the relation of these control signal or the like, in writing the input data F, the high-impedance control unit 75 is in the low impedance status, the RAM 76 is supplied with the control pulse and the flip-flop 83 is supplied with no clock pulses. On the other hand, in reading the data stored in the RAM 76, the high-impedance control unit 75 is in the high impedance status, the RAM 76 is supplied with no control pulses and the flip-flop 83 is supplied with the clock pulse.

The signal restoring device 84 divides the output data (DATAOUT) supplied from the flip-flop 83 into a first output data (DATA1OUT) G corresponding to the first input data (DATA1IN) A and a second output data (DATA2OUT) H corresponding to the second input data (DATA2IN) C to produce them as serial signals.

The operation of the memory control device so constructed according to the fifth embodiment is described.

First, the first counter 77 clears the counted value and starts counting up by receiving the first synchronous pulse (FP1) B twice.

On the other hand, the first input data (DATA1IN) A is converted into an 8-parallel signal (A') by the first serial/parallel converter 71. The converted data is supplied to the multiplier 74. The second input data (DATA2IN) C is subjected to synchronization in the channel level with the first input data (DATA1IN) by the shift register 72 (E). The second input data (DATA2IN) E is converted into an 8-parallel signal (E') by the second serial/parallel converter 73. The converted data (E') is then supplied to the multiplier 74. The multiplier 74 converts the signals (A' and E') into a time-division multiple signal (F) altered at every four bits to supply it to the high-impedance control unit 75.

The first ROM 79 supplied with the counted value from the first counter 77 successively produces address values R corresponding to the counted values U, and supplies to the address input terminal 76b in the RAM 76.

A description of the operations after that is omitted, because they are exactly the same as those in the second embodiment.

As mentioned above, according to the memory control device in the fifth embodimemt, the same effect as that of the second embodiment can be obtained by a simple constitution.

In any of the first to fifth embodiments as memtioned above, the writing/reading of memory is performed by the double-buffer technique in which the address area of one memory is devided into two. A double-buffer technique in which two memories are used is also applicable.

The memory control device according to the present invention is capable of processing the plural sequences of data simultaneously in the single device, keeping each individual phase to some extent. It becomes possible to reduce the number of the circuits as well as the scale of the device, because the circuits such as the RAM can be used for the above plural sequences of data.

The invention being thus described, it will be obvious that the same maybe varied in many ways. Such variations are not to be regarded as a departure from the spirit and scope of the invention, and all such modifications as would be obvious to one skilled in the art are intended to be included within the scope of the following claims.

What is claimed is:

1. A memory control device that receives a fixed length data consisting of a plurality of continuous unit data to store said fixed length data in storing means and that reads the unit data out of the storing means in a predetermined order to produce the fixed length data comprising:

delaying means for delaying one sequence of fixed length data relative to other sequence of fixed length data in such a manner that a header timing of each unit data forming the one sequence of the fixed length data coincides with a header timing of each unit data forming the other sequence of the fixed length data;

multiplying means for multiplying the one and other sequences of the fixed length data that are synchronized with each other by said delaying means for each data unit;

storing means for storing the one and other sequences of fixed length data multiplied by said multiplying means with being associated with a predetermined writing address and for producing the fixed length data stored according to a predetermined reading address;

writing address designating means for designating the predetermined writing address while changing said writing address according to a predetermined order;

reading address designating means for designating the predetermined reading address while changing said reading address according to a given order; and restoring means for restoring the multiplied fixed length data read out of the storing device to divide said multiplied fixed length data into separate sequences of the fixed length data for production.

2. A memory control device as claimed in claim 1, wherein the unit data is a data on one channel, and the fixed length data is a frame.

3. A memory control device as claimed in claim 1, wherein said multiplying means performs time-division multiplying operation to produce alternatively the one and other sequences of the fixed length data by the unit data.

4. A memory control device as claimed in claim 3, wherein said storing means has a plurality of storing areas each being assigned with an address, the storing area storing one of the unit data.

5. A memory control device as claimed in claim 4, wherein the order of changing the reading addresses designated by said reading address designating means is different from the order of changing the writing addresses designated by said writing address designating means.

6. A memory control device as claimed in claim 4, wherein said storing means alternatively writes and reads the fixed length data.

7. A memory control device as claimed in claim 6, wherein said writing address designating means and said reading address designating means are formed of identical address designating means, which alternatively designate the writing address and the reading address.

8. A memory control device as claimed in claim 7, wherein said address designating means receives a synchronous signal and starts designation of the reading writing address at a timing determined by the synchronous signal.

9. A memory control device as claimed in claim 8, wherein said address designating means is provided for each of the plural sequences of the fixed length data, and wherein said device further comprises multiplying means for multiplying the address designated by said address designating means in the same order as said multiplying device performs the time-division multiplying operation.

10. A memory control device as claimed in claim 1 further comprising phase difference detecting means for detecting a phase difference between the one and other sequences of fixed length data, wherein said delaying means determines an amount of delay of the fixed length data of the other sequence according to the phase difference detected by said phase difference detecting means.

11. A memory control device as claimed in claim 9 further comprising a phase difference detecting means for detecting a phase difference of the plural sequences of the fixed length data, wherein said delaying means determines an amount of delay of the fixed length data of the other sequence according to the phase difference detected by said phase difference detecting means.

12. A memory control device as claimed in claim 11 further comprising second delaying means for delaying an address value designated by said address designating means, the address value corresponding to the fixed length data of the other sequence in accordance with the phase difference detected by said phase difference detecting means, said second delaying means supplying the delayed address value to said multiplying means.

13. A memory control device as claimed in claim 1 further comprising serial-to-parallel converting means for converting the fixed length data before being supplied to said multiplying means from a serial signal to a parallel signal for every unit data.

14. A memory control method comprising:

receiving plural sequences of input data each consisting of a fixed length data consisting of a plurality of continuous unit data;

delaying one sequence of fixed length data relative to other sequence of fixed length data in such a manner that a header timing of each unit data forming the one sequence of the fixed length data coincides with a header timing of each unit data forming other sequence of the fixed length data;

multiplying the one sequence of the fixed length data with the other sequence of the fixed length data to produce a multiplied data input result after delay;

storing in a storing device the multiplied input data result according to addresses continuously designated in a predetermined order;

reading out of the storing device the data stored in the storing device according to addresses continuously designated in a predetermined order; and restoring the multiplied fixed length data read out of the storing device to divide it into separate sequences of the fixed length data for production.

\* \* \* \* \*

UNITED STATES PATENT AND TRADEMARK OFFICE
CERTIFICATE OF CORRECTION

PATENT NO. : 5,477,490
DATED : December 19, 1995
INVENTOR(S) : Miyawaki et al.

It is certified that error appears in the above-indentified patent and that said Letters Patent is hereby corrected as shown below:

Column 1, line 8, delete "that each" and insert --where each system--.

Column 1, line 8, after "on" insert --a--.

Column 1, line 15, delete "lequipment" and insert --equipment--.

Column 2, line 22, after "reading" insert --of--.

Column 2, line 33, delete "in synchronism" and insert --sychronous with--.

Column 2, line 35, start new paragraph after "503".

Column 2, line 63, delete "varing" and insert --varying--.

UNITED STATES PATENT AND TRADEMARK OFFICE
CERTIFICATE OF CORRECTION

PATENT NO. : 5,477,490
DATED : December 19, 1995
INVENTOR(S) : Miyawaki et al.

It is certified that error appears in the above-indentified patent and that said Letters Patent is hereby corrected as shown below:

Column 3, line 10, delete "varing" and insert --varying--.

Column 3, line 13, delete "to the outside" and insert --from--.

Column 5, line 13, delete "being".

Column 6, line 2, delete "wiring" and insert --writing--.

Column 6, line 3, delete "wiring" and insert --writing--.

Column 6, line 40, delete "desinated" and insert --designated--.

Column 7, line 15, delete "facilitate the" and insert --further--.

Column 7, line 54, delete "adress" and insert --address--.

UNITED STATES PATENT AND TRADEMARK OFFICE
CERTIFICATE OF CORRECTION

PATENT NO. : 5,477,490
DATED : December 19, 1995
INVENTOR(S) : Miyawaki et al.

It is certified that error appears in the above-indentified patent and that said Letters Patent is hereby corrected as shown below:

Column 8, line 22, delete "$\Delta$" and insert --$\alpha$--.

Column 8, line 24, delete "$0 \leq \leq 8$" and insert --$0 \leq \beta \leq 8$--.

Column 8, line 49, start a new paragraph after "(DATA2IN)C.".

Column 8, line 54, after "(FPW)T." start a new paragraph

Column 9, line 10, after "FIG.5;" start a new paragraph.

Column 9, line 65, delete "values" and insert --value--.

Column 9, line 65, delete "counted value" and insert --counted values--.

Column 10, line 17, delete "values" and insert --value--.

UNITED STATES PATENT AND TRADEMARK OFFICE
CERTIFICATE OF CORRECTION

PATENT NO. : 5,477,490
DATED : December 19, 1995
INVENTOR(S) : Miyawaki et al.

It is certified that error appears in the above-indentified patent and that said Letters Patent is hereby corrected as shown below:

Column 10, line 17, delete "counted value" and insert --counted values--.

Column 10, line 30, delete "memtioned" and insert --mentioned--.

Column 10, line 35, delete "to say at" and insert --thus inputs at an--.

Column 11, line 4, delete "twice" and insert --two--.

Column 12, line 50, start a new paragraph before "The RAM 6".

Column 13, line 34, delete "difference phase" and insert --different phase--.

UNITED STATES PATENT AND TRADEMARK OFFICE
CERTIFICATE OF CORRECTION

PATENT NO. : 5,477,490
DATED : December 19, 1995
INVENTOR(S) : Miyawaki et al.

It is certified that error appears in the above-indentified patent and that said Letters Patent is hereby corrected as shown below:

Column 13, line 38, start a new paragraph therefor after "described.".

Column 13, line 60, delete "brocks" and insert --blocks--.

Column 15, line 19, delete "these" and insert --this--.

Column 18, line 60, delete "adress" and insert --address--.

Column 18, line 62, delete "adress" and insert --address--.

Column 20, line 4, start a new paragraph after "FIG.5).".

Column 20, lines 29-30, delete "onw address values" and insert --one address value--.

Column 20, line 30, delete "value" and insert --values--.

Column 20, line 47, delete "values to two counted value"

UNITED STATES PATENT AND TRADEMARK OFFICE
CERTIFICATE OF CORRECTION

PATENT NO. : 5,477,490
DATED : December 19, 1995
INVENTOR(S) : Miyawaki et al.

It is certified that error appears in the above-indentified patent and that said Letters Patent is hereby corrected as shown below:

and insert --value to two counted values--.

Column 22, line 49, delete "adress" and insert --address--.

Column 24, line 18, delete "values to two counted value" and insert --value to two counted values".

Column 24, lines 23-24, delete "it produces in order of".

Column 24, line 29, after " specifically" insert --the ROM 79 produces--.

Signed and Sealed this

Seventeenth Day of June, 1997

BRUCE LEHMAN

Attest:

Attesting Officer

Commissioner of Patents and Trademarks